US008497166B2

(12) United States Patent
Umemura et al.

(10) Patent No.: US 8,497,166 B2
(45) Date of Patent: Jul. 30, 2013

(54) ELECTRONIC DEVICE AND METHOD OF MANUFACTURING ELECTRONIC DEVICE

(75) Inventors: Hirokazu Umemura, Tochigi (JP); Kenichi Fuke, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 13/387,305

(22) PCT Filed: Aug. 24, 2010

(86) PCT No.: PCT/JP2010/064309
§ 371 (c)(1),
(2), (4) Date: Jan. 26, 2012

(87) PCT Pub. No.: WO2011/024820
PCT Pub. Date: Mar. 3, 2011

(65) Prior Publication Data
US 2012/0146232 A1    Jun. 14, 2012

(30) Foreign Application Priority Data

Aug. 24, 2009  (JP) ................. 2009-192759
Jan. 29, 2010  (JP) ................. 2010-018397

(51) Int. Cl.
*H01L 21/00*       (2006.01)

(52) U.S. Cl.
USPC ........... 438/127; 438/124; 438/126; 257/787; 257/E23.116

(58) Field of Classification Search
USPC ............... 438/124, 126, 127, 121; 257/100, 257/508, 687, 773, 787, E23.006, E23.116, 257/E23.129
See application file for complete search history.

(56) References Cited

U.S. PATENT DOCUMENTS 7,834,470 B2 * 11/2010 Taya et al. .................. 257/790
2005/0104189 A1 * 5/2005 Akagawa et al. ............ 257/696
2010/0075466 A1 * 3/2010 Chew et al. ................. 438/127

FOREIGN PATENT DOCUMENTS

| JP | 53-122650 | | 9/1978 |
| JP | 55-88245 U | | 6/1980 |
| JP | 3-28742 U | | 3/1991 |
| JP | 2000-311970 A | | 11/2000 |
| JP | 2000311970 A | * | 11/2000 |
| JP | 3719420 B2 | | 10/2003 |
| JP | 2005-150621 A | | 6/2005 |

* cited by examiner

*Primary Examiner* — Matthew W Such
*Assistant Examiner* — Stephen Bradley
(74) *Attorney, Agent, or Firm* — Arent Fox LLP

(57) ABSTRACT

An electronic device in which a metal wire (119) is bonded to an electronic component (111) contained in a case (110) by wire bonding and a bonding surface (121, 122) to which the metal wire (119) is bonded is covered with a synthetic resin (130) is manufactured by injecting an amount of synthetic resin (130) into the case (110) such that at least a portion of the metal wire (119) is exposed from a top surface of the synthetic resin (130); and leaving the case (110) to which the synthetic resin (130) is injected under reduced pressure so as to raise a liquid surface of the synthetic resin (130) due to the reduced pressure, and covering the metal wire (119) exposed from the top surface of the synthetic resin (130) with the synthetic resin (30, 130).

5 Claims, 9 Drawing Sheets

ELECTRONIC DEVICE AND METHOD OF MANUFACTURING ELECTRONIC DEVICE

CROSS-REFERENCE TO RELATED APPLICATION

This Application is a National Stage entry of International Application No. PCT/JP2010/064309, having an international filing date of Aug. 24, 2010; which claims priority to Japanese Application Nos.: 2009-192759, filed Aug. 24, 2009 and 2010-018397, filed Jan. 29, 2010; the disclosure of each of which is hereby incorporated in its entirety by reference.

TECHNICAL FIELD

The present invention relates to an electronic device including a semiconductor device and so on, and a method of manufacturing the electronic device.

BACKGROUND ART

Conventionally, an electronic device that includes semiconductor devices and the like are known in which after contact points are connected by wire bonding, in order to secure moisture resistance of the contact points having been subject to the wire bonding, a case accommodating a semiconductor device is filled with a gelatinous synthetic resin, such that contact point portions are covered by the synthetic resin. As for this structure, it has been pointed out that if the filled synthetic resin vibrates, the vibration might be transferred to wires, resulting in breaking of the wires. For this reason, methods of preventing vibration of wires by reducing an amount of filled synthetic resin in the above-mentioned structure have been proposed (for example, see Patent Document 1). Patent Document 1 discloses a method which puts a power device having a metal wire connected thereto by wire bonding in a case, injects Silicone Resin into the case from above, inserts a suction nozzle into the case, and sucks the Silicone Resin until a required height is obtained.

However, in the method disclosed in Patent Document 1, since a process for sucking the injected Silicone Resin is newly added, there is a concern that a manufacturing lead time for electronic devices might extend and a manufacturing cost might increase due to investment in suction equipment. Also, for example, in a high-current power device, metal wires are disposed at high density. Therefore, if the above-mentioned method is applied to that device, it is required to secure a space for inserting the suction nozzle while avoiding wires, and thus there is a concern that the areas of electronic devices might increase and the sizes of products might increase. Further, in a case of suppressing an amount of synthetic resin as disclosed Patent Document 1, although vibration is not transferred to wires, the wires may not be covered by the synthetic resin. For example, in a power device, since wires are disposed at high density, in order to prevent neighboring wires from being short-circuited, it is preferable to cover the wires with a synthetic resin. Even in other electronic devices, it is important to secure the corrosion resistance of wires and prevent wires and other components, or wires from being short-circuited. Therefore, covered wires are very advantageous.

PRIOR ART DOCUMENT

Patent Document

Patent Document 1: JP-B2-3719420

SUMMARY OF INVENTION

One or more embodiments of the present invention provide a structure in which an electronic component subjected to a wire bonding is covered with a synthetic resin, and which is capable of preventing vibration of the synthetic resin from being transferred to the wire and the wire is covered with the synthetic resin.

According to one or more embodiments of the present invention, an electronic device is provided with a case, an electronic component that is contained in the case, a metal wire bonded to the electronic component by wire bonding, and a synthetic resin covering a bonding surface to which the metal wire is bonded and the metal wire.

The metal wire may be covered with the synthetic resin by injecting an amount of synthetic resin such that a portion of the metal wire is exposed from a top surface of the synthetic resin in the case, leaving the case under reduced pressure such that a liquid surface of the synthetic resin rises and the synthetic resin is attached to the metal wire exposed from the top surface of the synthetic resin so as to cover the metal wire.

According to this structure, the electronic component having the metal wire bonded thereto by the wire bonding is contained in the case, the bonding surface is covered with the synthetic resin injected into the case, and the metal wire is exposed from the top surface of the synthetic resin. Therefore, it is difficult for vibration of the synthetic resin to be transferred to the metal wire. Further, the synthetic resin is attached even to the metal wire exposed from the top surface of the synthetic resin by raising the liquid surface of the synthetic resin under reduced pressure, such that the metal wire is covered with the synthetic resin. Therefore, it is possible to improve the corrosion resistance of the metal wire and protect insulation. Accordingly, it is possible to implement an electronic device which can be manufactured without introduction of new equipment or an increase in the size of the electronic device, and prevent vibration of the synthetic resin from being transferred to a metal wire by covering the bonding surface of the electronic device with the synthetic resin, and includes the metal wire covered with the synthetic resin. Further, while the case having the injected synthetic resin is left under reduced pressure, degassing for removing air bubbles and moisture is performed. The degassing may be performed in the process of attaching the synthetic resin to the metal wire, such that the number of processes is reduced.

The above-mentioned structure may further include a resin receiving portion which is provided to the case, and allows the synthetic resin to flow therein in a case where the liquid surface of the injected synthetic resin becomes higher than the metal wire.

According to this structure, in the case where the liquid surface of the synthetic resin reaches a height to cover the metal wire under the reduced pressure, the synthetic resin flows into the resin receiving portion. Therefore, it is possible to easily confirm that the metal wire has been covered with the synthetic resin, by detecting the inflow of the synthetic resin into the resin receiving portion.

In the above-mentioned structure, the resin receiving portion may be a recess portion which is exposed to an internal space of the case, and an edge of the recess portion may be positioned at the same height as that of an upper edge of the metal wire.

According to this structure, in a case where the liquid surface of the synthetic resin rises beyond the metal wire under the reduced pressure, the synthetic resin surely flows and is accumulated in the recess portion of the resin receiving portion. Therefore, it is possible to easily and quickly detect that the metal wire has been covered with the synthetic resin up to the upper portion of the metal wire, by detecting the synthetic resin accumulated in the recess portion.

In the above-mentioned structure, the resin receiving portion may have a recess portion that is formed by cutting a side wall of the case to be exposed to the internal portion of the case, and an edge of the recess portion may be positioned at the same height as that of an upper edge of the metal wire.

According to this structure, it is possible to easily and quickly detect that the metal wire has been covered with the synthetic resin up to the upper portion of the metal wire, by detecting the synthetic resin accumulated in the recess portion. Further, since the recess portion is formed by cutting the side wall of the case, it is not required to ensure a space for providing the recess portion in the case. Therefore, it is possible to more easily and quickly detect that the metal wire has been covered with the synthetic resin up to the upper portion of the metal wire, without restricting arrangement of individual units in the case and damaging the degree of freedom of a layout of the inside of the case.

The above-mentioned structure may further include a through-hole that is provided in a side wall of the case and discharges the synthetic resin from the case in the case where the liquid surface of the injected synthetic resin becomes higher than the metal wire bonded to the electronic component, and the resin receiving portion may include a recess portion that is provided in the outer side of the case below the through-hole, and stores the synthetic resin discharged from the through-hole.

According to this structure, in the case where the liquid surface of the synthetic resin rises beyond the metal wire under the reduced pressure, the synthetic resin surely flows and is accumulated in the recess portion of the resin receiving portion through the through-hole. Therefore, it is possible to detect that the metal wire has been covered with the synthetic resin up to the upper portion of the metal wire, by detecting the synthetic resin accumulated in the recess portion. Further, since the recess portion of the resin receiving portion is provided on the outer side of the case, it is possible to easily detect the synthetic resin accumulated in the recess portion, without influencing a layout state of the electronic component and the metal wire in the case. Furthermore, it is not required to secure a space for providing the recess portion in the case. Therefore, it is possible to more easily and quickly detect that the metal wire has been covered with the synthetic resin up to the upper portion of the metal wire, without restricting arrangement of individual units in the case for the circumstances of the detection process and damaging the degree of freedom of a layout of the inside of the case.

According to one or more embodiments, in a method of manufacturing an electronic device in which a metal wire is bonded to an electronic component contained in a case by wire bonding and a bonding surface to which the metal wire is bonded is covered with a synthetic resin, the method includes a process (injection process) of injecting an amount of synthetic resin into the case such that at least a portion of the metal wire is exposed from a top surface of the synthetic resin, and a process (depressurizing process) of leaving the case having the injected synthetic resin under reduced pressure so as to raise a liquid surface of the synthetic resin due to the reduced pressure such that the metal wire exposed from the top surface of the synthetic resin is covered with the synthetic resin.

According to this method, it is possible to manufacture an electronic device in which an electronic component having a metal wire bonded thereto by wire bonding is contained in a case, a bonding surface is covered with a synthetic resin injected into the case, and the metal wire is exposed from the top surface of the synthetic resin such that it is difficult for vibration of the synthetic resin to be transferred to the metal wire. As for the metal wire, since the liquid surface of the synthetic resin rises in the depressurizing process, it is possible to attach the synthetic resin to the portion of the metal wire exposed from the top surface of the resin receiving portion such that the exposed portion of the metal wire is covered with the synthetic resin, without injecting an amount of synthetic resin such that the entire metal wire is soaked. Therefore, it is possible to cover the bonding surfaces of the electronic device with the synthetic resin and expose the metal wire from the top surface of the synthetic resin such that vibration of the synthetic resin is prevented from being transferred to the metal wire, without introduction of new equipment or an increase in the size of the electronic device, and to cover the metal wire with the synthetic resin. Further, in the depressurizing process, since the case having the injected synthetic resin is left under the reduced pressure, during that time, it is possible to perform degassing so as to remove air bubbles and moisture in the case. Therefore, since the degassing is performed in the process of raising the liquid surface of the synthetic resin so as to attach the synthetic resin to the metal wire, it is possible to reduce the number of processes.

Here, the synthetic resin may be a synthetic resin which is a fluid in the injection process, and hardens after the depressurizing process. Also, after the depressurizing process, a hardening process for hardening the synthetic resin into a solid state or a gel state may be provided. In this hardening process, it is preferable to harden the synthetic resin during a time period when the synthetic resin attached to the metal wire in the depressurizing process does not peel off from the metal wire.

In the above-mentioned method, both ends of the metal wire may be bonded to the bonding surfaces such that the metal wire is upwardly convex. Also, when the synthetic resin is injected into the case, the synthetic resin may be injected up to a height to expose at least an apex portion of the convex metal wire from the top surface of the injected synthetic resin and cover the entire bonding surface with the injected synthetic resin.

According to this method, in a state in which the metal wire which is upwardly convex is exposed from the top surface of the synthetic resin, it is possible to cover the bonding surface with the synthetic resins, more reliably.

Further, when the synthetic resin is injected into the case, an injection nozzle for injecting the synthetic resin into the case may move above the metal wire, and may apply the synthetic resin to the portion of the metal wire exposed from the top surface of the liquid surface of the synthetic resin.

According to this method, when the synthetic resin is injected, the synthetic resin is applied from above the metal wire. Therefore, it is possible to more reliably attach the synthetic resin to even the portion of the metal wire exposed from the top surface of the injected synthetic resin, such that the metal wire is covered with the synthetic resin.

Also, the case may include a resin receiving portion that allows the synthetic resin to flow therein in a case where the liquid surface of the injected synthetic resin becomes higher than the metal wire, and the synthetic resin flowing into the resin receiving portion may be detected.

According to this method, in the detection process, it is possible to easily confirm that the metal wire has been covered with the synthetic resin, by detecting the inflow of the synthetic resin into the resin receiving portion, so as to prevent the metal wire from being incompletely covered. Therefore, it is possible to quickly manufacture electronic devices capable of improving the corrosion resistance and protecting the insulation of metal wires by covering the metal wires with a synthetic resin, at a high yield rate.

In the above-mentioned method, the resin receiving portion may include a recess portion for storing the synthetic resin, and the synthetic resin flowing into the recess portion may be optically detected by irradiating inspection light onto the recess portion.

According to the above-mentioned method, the inspection light is irradiated to optically detect whether the liquid surface of the synthetic resin has risen beyond the metal wire in the depressurizing process such that the synthetic resin has flowed into the recess portion of the resin receiving portion. Therefore, it is possible to easily and quickly detect that the metal wire has been covered with the synthetic resin up to the upper portion of the metal wire, by a contactless method.

Also, according to one or more embodiments of the present invention, a method of manufacturing an electronic device, in which a metal wire is attached to an electronic component contained in a case by wire bonding and a bonding surface, which the metal wire has been bonded to, is covered with a synthetic resin for sealing, includes a process of injecting the synthetic resin into the case from above the electronic component by an injection nozzle, and in this process, the injection nozzle moves above the metal wire and drops the synthetic resin from above the metal wire such that the synthetic resin is attached to the metal wire. According to this method, the electronic component to which the metal wire has been bonded by the wire bonding is contained in the case, the bonding surface is covered with the synthetic resin injected into the case, and the metal wire is exposed from the synthetic resin. Therefore, it is possible to manufacture an electronic device in which it is difficult for vibration of a synthetic resin to be transferred to a metal wire. In the process of injecting the synthetic resin, since the injection nozzle moves and drops the synthetic resin from above the metal wire, it is possible to cover the metal wire with the synthetic resin. Since the bonding surface of the electronic device is covered with the synthetic resin such that the metal wire is exposed from the top surface of the synthetic resin, it is possible to prevent vibration of the synthetic resin from being transferred to the metal wire and cover the metal wire with the synthetic resin. In this method, there is an advantage that introduction of new equipment, for example, for suction, and an increase in the size of the electronic device are not accompanied. Further, since the amount of synthetic resin that is injected into the case is suppressed, it is possible to reduce the cost, and since the time for hardening the synthetic resin is reduced, it is possible to reduce the lead time.

Other aspects and advantages of the invention will be apparent from the following description and the appended claims

DESCRIPTION OF EMBODIMENTS

Hereinafter, embodiments of the present invention will be described with reference to the accompanying drawings.
[First Exemplary Embodiment]

Figure 1:
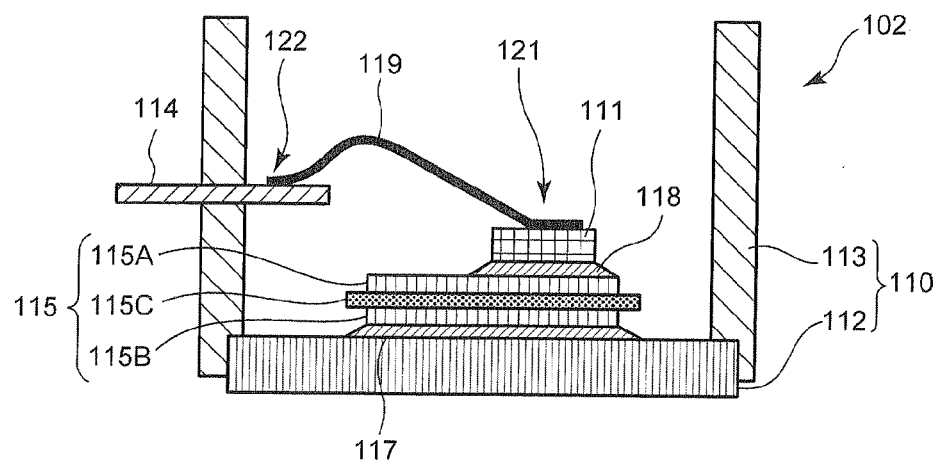
FIG. 1 is a main-part cross-sectional view illustrating a structure of a switching device according to a first exemplary embodiment.

FIG. 1 is a main-part cross-sectional view illustrating a schematic structure of a switching module 102 according to a first exemplary embodiment of the present invention. The switching module 102 shown in FIG. 1 is configured by putting a substrate 115, having a semiconductor device 111 mounted thereon, in a case 110 having an opening provided at an upper face. The semiconductor device 111 is an electronic device and is a switching device for power supply corresponding to high current, such as an IGBT, a power MOSFET, a thyristor, or a diode. The substrate 115 is a triple-layered substrate that is formed by bonding an upper insulating substrate 115A, a lower insulating substrate 115B, and an insulating substrate 115C interposed there between with a brazing material. On the upper insulating substrate 115A and the lower insulating substrate 115B, for example, circuit patterns constituting a power supply circuit are formed. The semiconductor device 111 is electrically connected to the patterns formed on the upper insulating substrate 115A and the lower insulating substrate 115B by solder 118.

The case 110 includes a base 112 constituting a bottom, and a substantially cylindrical housing 113 fixed to the circumferential edge portion of the base 112. The housing 113 and the base 112 are fixed to each other by an adhesive, so as to prevent a liquid from being leaked, and it is possible to fill the case 110 with a liquid. On an upper surface of the base 112, a lower portion of the substrate 115 is fixed by an insulating bonding material 117. In the housing 113, an external terminal 114 is provided to protrude outward from the case 110. The external terminal 114 is a metal terminal that penetrates the housing 113 to extend over the inside and outside of the case 110, and to be connected to a circuit on the outside of the case 110. The external terminal 114 is provided for connecting the semiconductor device 111 contained in the case 110 to a circuit on the outside of the case 110, and in the case 110, the external terminal 114 and the semiconductor device 111 are electrically connected to each other a wire 119 (metal wire).

The wire 119 is a metal wire formed by wire bonding, specifically, a wire that is made of gold or aluminum and has a thickness of several μm to several hundreds μm. One end of the wire 119 is bonded to a metal portion of an external connection terminal (not shown) of the semiconductor device 111 by a load and an ultrasonic wave, and the other end of the wire 119 is bonded to the external terminal 114 in the same way, such that the external connection terminal and the external terminal 114 are electrically connected to each other through the wire 119. Here, a portion (surface) of the semiconductor device 111 bonded to the wire 119 is referred to as a bonding surface 121, and a portion (surface) of the external terminal 114 bonded to the wire 119 is referred to as a bonding surface 122. In a state shown in FIG. 1, the metals of the bonding surfaces 121 and 122 are exposed to the atmosphere. Both ends of the wire 119 are bonded to the bonding surfaces 121 and 122 such that a center portion of the wire 119 is upwardly convex and both ends of the wire 119 are lowest. Then, Silicone Resin is injected into the switching module 102 shown in FIG. 1 so as to cover the bonding surfaces 121 and 122, thereby manufacturing the switching device 101 as an electronic device.

A method of manufacturing the switching device 101 includes the following three processes.

1. An injection process of injecting the Silicone Resin into the switching module 102
2. A depressurizing process of leaving the switching module 102 having the injected Silicone Resin under reduced pressure
3. A hardening process of hardening the Silicone Resin The Silicone Resin injected into the case 110 may be a two-component resin that is made by mixing a curing agent with a base component, and has a predetermined degree of viscosity and mobility during injection and then hardens under predetermined hardening conditions so as to be a gel state or solid. Examples of the hardening condition for Silicone Resin 130 include light (ultra violet light) irradiation, heating, and so on. Typical hardening conditions for thermosetting Silicone Resin having a temperature and a time period as hardening conditions include a temperature of room temperature (20° C.±15° C. according to Japanese Industry Standards) to 150° C. and a time period of about several minutes to 3 hours. In the first exemplary embodiment, an example using the thermosetting Silicone Resin 130 (FIGS. 2 to 5) that hardens under conditions of 80° C. and 1 hour will be described.

Figure 2:
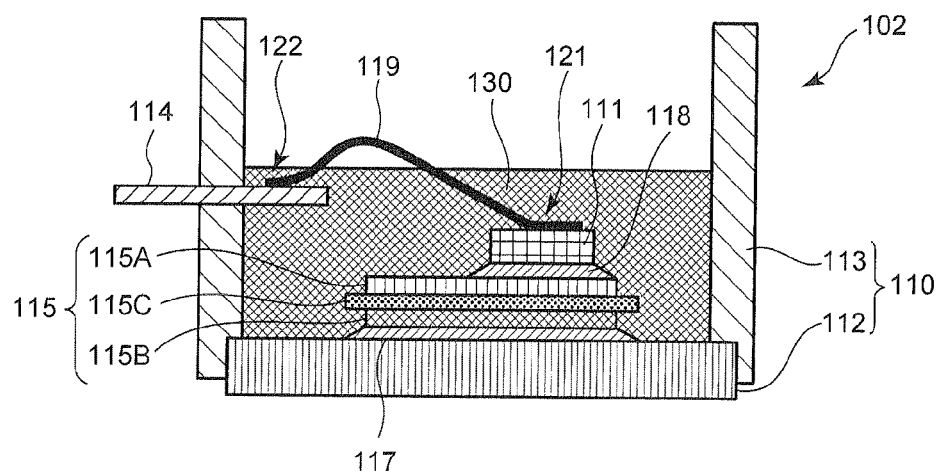
FIG. 2 is an explanatory view of an injection process.

FIG. 2 is an explanatory view illustrating the injection process, and shows a main-part section of the switching module 102, similarly to FIG. 1. In the injection process, the Silicone Resin 130 is injected into the case 110 of the switching module 102 from above, and an injection amount of the Silicone Resin 130 is controlled such that a liquid surface of the Silicone Resin 130 becomes a height shown by a reference symbol LH in FIG. 3. The height LH of the liquid surface of the Silicone Resin 130 is sufficiently lower than a height T of the uppermost portion (wire top) of the wire 119. The height LH is determined such that the metals of the bonding surfaces 121 and 122 soak in the Silicone Resin 130 and the apex portion of the wire 119 and the vicinity thereof are exposed from the top surface of the liquid surface of the Silicone Resin 130. The height LH is an indicator of the amount of Silicone Resin 130 which is injected in the injection process. In other words, the injection amount is determined such that the height of the liquid surface becomes the height LH in a state in which the liquid surface of the Silicone Resin 130 is still in the injection process. Therefore, even if the liquid surface becomes disordered by mobility of the Silicone Resin 130 in the injection process such that the liquid surface becomes higher than the height LH, there are no problems. The injection process may be performed under normal pressure or may be performed under reduced pressure. In other words, when the Silicone Resin 130 is injected into the switching module 102 by an apparatus to be described below, the entire switching module 102 and the injection nozzle for injecting the Silicone Resin 130 may be put in a chamber, and the inside of the chamber may be depressurized, and the Silicone Resin 130 may be injected by so-called vacuum injection. If the vacuum injection is performed, there are advantages such as an advantage that it is possible to quickly inject the Silicone Resin 130.

After the Silicone Resin 130 is injected into the case 110, the depressurizing process is performed. In the depressurizing process, the switching module 102 is left in a depressurized environment for a predetermined period. In the depressurizing process, the switching module 102 having the injected Silicone Resin 130 is put in an airtightly closable room (such as a chamber), and the degree of vacuum of the inside of the room is set to 600 Pa to 1000 Pa. Further, in the depressurizing process, the switching module 102 is left with the above-mentioned degree of vacuum for about 10 minutes to 1 hour. Further, when the above-mentioned vacuum injection is performed in the injection process, after the injection of the Silicone Resin 130 is completed, the depressurizing process is performed. In the depressurizing process, the switching module 102 is continuously left in the depressurized environment. In this case, the degree of vacuum of the inside of the chamber containing the switching module 102 in the depressurizing process may be higher than that in the injection process (the pressure of the inside of the chamber in the depressurizing process may be lower than that in the injection process), or may be the same as that in the injection process.

Figure 3:
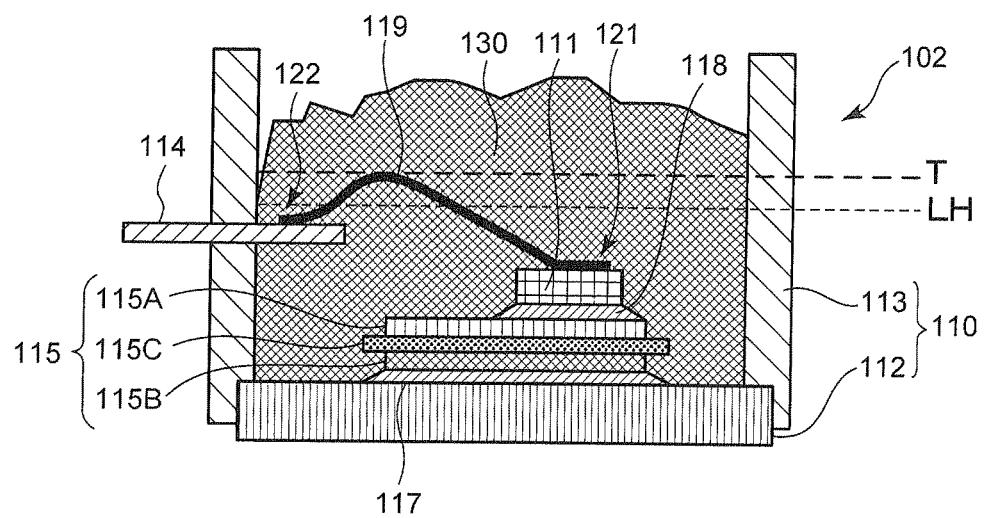
FIG. 3 is an explanatory view of a depressurizing process.

In the depressurizing process, in the switching module 102, air below the semiconductor device 111 and in gaps such as a gap between the substrate 115 and the base 112 is expanded to form air bubbles by depressurizing, and the air bubbles come up in the Silicone Resin 130. Since the expanded air bubbles come up in the Silicone Resin 130 from the vicinity of the lower portion of the case 110, the Silicone Resin 130 foams and inflates all over, such that the liquid surface of the Silicone Resin 130 rises as shown in FIG. 3. In this state, the liquid surface of the Silicone Resin 130 rises far beyond the height LH, such that the apex portion of the wire 119 exposed from the top surface of the Silicone Resin 130 in the injection process soaks in the Silicone Resin 130 and the Silicone Resin 130 is attached to the entire wire 119.

In a state in which the switching module 102 is placed under the reduced pressure, as time goes on, the air existing in the gaps in the case 110 comes out from the Silicone Resin 130, the inflating of the air bubbles lessens. Therefore, the liquid surface of the Silicone Resin 130 lowers to the height LH according to the amount injected in the injection process. However, since the Silicone Resin 130 has high viscosity, even after the liquid surface of the Silicone Resin 130 returns to the height LH, the Silicone Resin 130 attached to a surface of a portion having soaked in the Silicone Resin 130 once remains as a coating film. On the basis of the viscosity of general Silicone Resin, it is apparent that the coating film remains for several hours to several tens of hours. In the depressurizing process, since the Silicone Resin 130 inflates up to the position of the wire top T, a coating film is made of the Silicone Resin 130 all over the wire 119.

The inflating height of the Silicone Resin 130 in the depressurizing process depends on the size of the substrate 115 contained in the case 110, the number of elements such as the semiconductor device 111 mounted on the substrate 115, the property of the Silicone Resin 130, the degree of vacuum in the depressurizing process, and a transition speed from the normal pressure to a target degree of vacuum, and so on. Therefore, these may be considered to determine the amount of Silicone Resin 130 to be injected in the injection process, such that the Silicone Resin 130 can inflate up to the position T of the wire top in the depressurizing process. The time period when the switching module 102 is left in the depressurizing process is not particularly limited as long as degassing can be sufficiently performed. Therefore, it is preferable to determine the time period on the basis of the number of elements in the switching module 102, the property of the Silicone Resin 130, and the degree of vacuum in the depressurizing process. In general, as the degree of vacuum increases and the time period lengthens, the degassing can be performed more reliably. Therefore, it is preferable to determine the degree of vacuum and the time period, considering a degassed state and productivity.

The Silicone Resin 130 injected into the switching module 102 contains the curing agent. In the hardening process, the switching module 102 is left in an environment satisfying the hardening conditions for the Silicone Resin 130 for a predetermined time period. For example, in a case of using thermosetting Silicone Resin, the switching module 102 is left in a state in which a predetermined temperature or higher temperature (the room temperature to 150° C.) is maintained. In a case of using photo-curable Silicone Resin, light is irradiated by an ultra violet light ramp (not shown). In the first exemplary embodiment, as described above, the switching module 102 is left at 80° C. for 1 hour until the Silicone Resin 130 hardens. Since the coating film of the Silicone Resin 130 formed on the wire 119 as described above is maintained for a long time due to the viscosity of the Silicone Resin 130, in the hardening process, the coating film becomes a gel state or solid. Therefore, the wire 119 is covered with the coating film of the Silicone Resin 130 having lost the mobility. In the hardening process, the switching module 102 may be placed under the reduced pressure, continuously to the depressurizing process, or the degree of vacuum may gradually decrease up to the normal pressure. The hardening process may be performed after the normal pressure is achieved.

Figure 4:
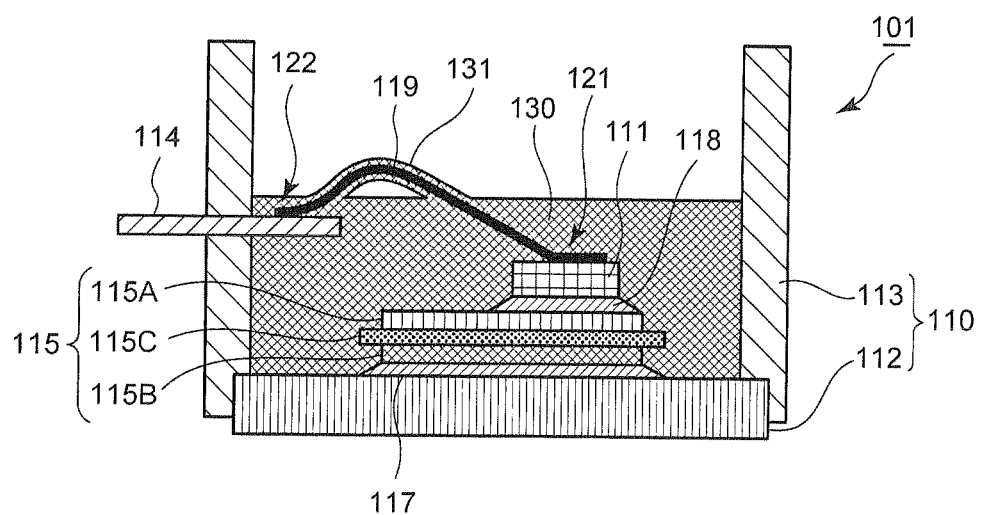
FIG. 4 is a main-part cross-sectional view illustrating the structure of the switching device according to the first exemplary embodiment.

Through the injection process, the depressurizing process, and the hardening process, the switching device 101 shown in FIG. 4 is completed. FIG. 4 is a main-part cross-sectional view illustrating a structure of the manufactured switching device 101. In the case 110 of the switching device 101, the Silicone Resin 130 has been filled up to the height LH so as to cover both of the bonding surfaces 121 and 122, and has hardened in a gel state, and a portion of the wire 119 is exposed from the top surface of the Silicone Resin 130. The portion of the wire 119 exposed from the top surface of the Silicone Resin 130 has been covered by a coating resin film 131 that has been formed by the hardening of the Silicone Resin 130.

Figure 5:
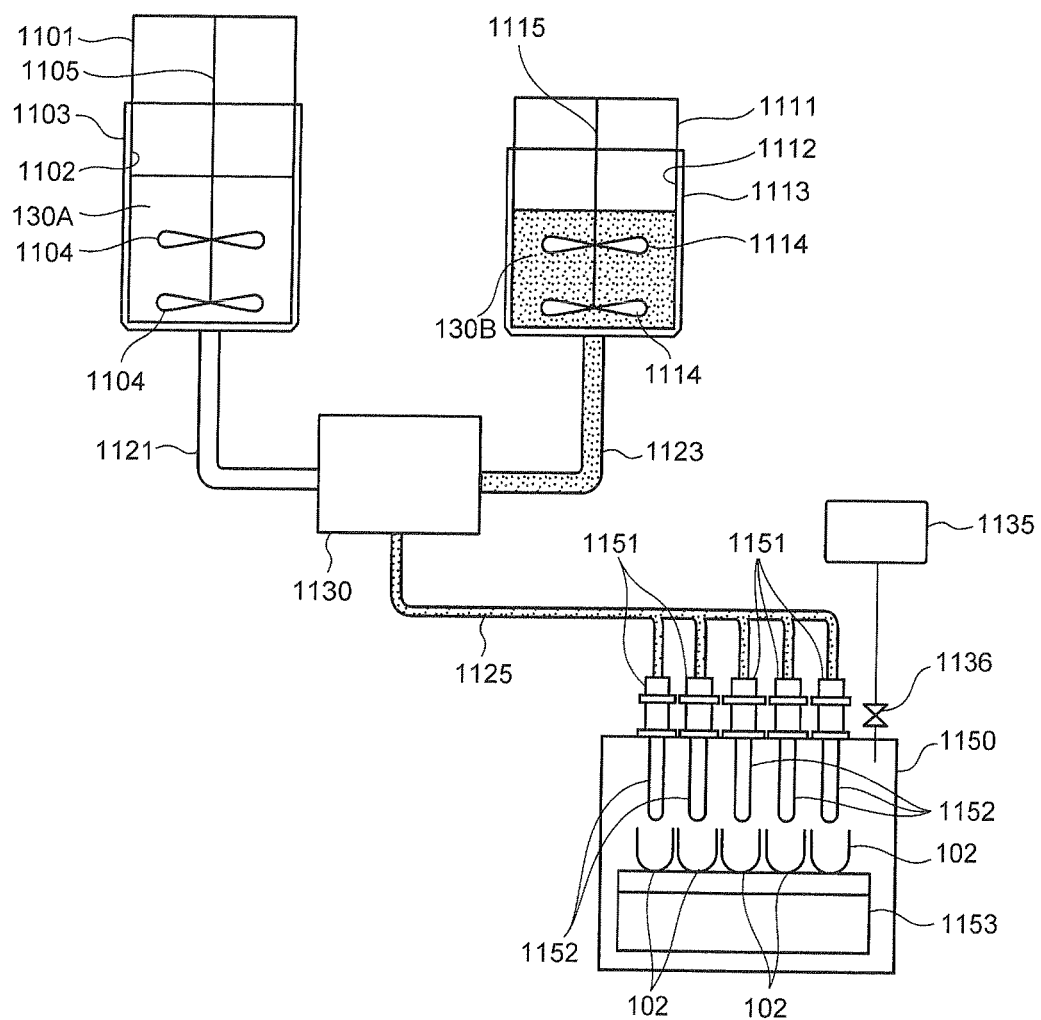
FIG. 5 is a schematic diagram illustrating a configuration of an injection apparatus that is used for manufacturing the switching device.

FIG. 5 is a schematic view illustrating a configuration of an injection apparatus 1100 for implementing the manufacturing method that has been described with reference to FIGS. 2 to 4. The injection apparatus 1100 shown in FIG. 5 can be used to perform a series of processes including the injection process, the depressurizing process, and the hardening process.

The injection apparatus 1100 is an apparatus capable of injecting the two-component Silicone Resin 130 into the switching module 102. The injection apparatus 1100 includes a vacuum chamber 1150 that accommodates the switching module 102 as an injection subject. The vacuum chamber 1150 includes a cradle 1153 that allows a plurality of switching modules 102 to be placed side by side thereon, and a plurality of injection nozzles 1152 that is provided to be suspended from the ceiling inside the vacuum chamber 1150 such that it is possible to inject the Silicone Resin 130 into the plurality of switching modules 102 by the injection nozzles 1152.

The vacuum chamber 1150 is configured to be airtightly closable, and is connected to a vacuum pump 1135 through a valve 1136. The vacuum pump 1135 can be used to depressurize the inside of the vacuum chamber 1150 and maintain a vacuum state during injection and after injection. The vacuum chamber 1150 includes a heater (not shown) capable of heating the inside up to about 150° C., and a temperature sensor (not shown) that detects the temperature of the inside. According to a detection value of the temperature sensor, power supply to the heater can be controlled such that the temperature of the inside of the vacuum chamber 1150 is adjusted.

The injection apparatus 1100 includes a main-component tank 1101 for storing a main component 130A for the Silicone Resin 130, and a curing-agent tank 1111 for storing a curing agent 130B. The main component 130A and the curing agent 130B are mixed and then injected into the switching modules 102. The main-component tank 1101 includes a heater 1102 and a sub heater 1103 for heating the main component 130A, and a stirring mechanism 1105 having stirring blades 1104. The stirring mechanism 1105 is driven by a motor (not shown), so as to stir the main component 130A. Meanwhile, the curing-agent tank 1111 includes a heater 1112 and a sub heater 1113 for heating the curing agent 130B. Further, the curing-agent tank 1111 includes a stirring mechanism 1115 having stirring blades 1114. The stirring mechanism 1115 is driven by a motor (not shown), so as to stir the curing agent 130B. Although the injection apparatus 1100 includes the heaters 1102 and 1112, the sub heaters 1103 and 1113, and other various heaters, in a case where materials that does not require heating are used as the main component 130A and the curing agent 130B, since the injection apparatus does not need to have the heaters, the injection apparatus may be configured to have no heaters.

The main component 130A in the main-component tank 1101 is supplied to a quantitative mixing unit 1130 through a main-component supply pipe 1121 having a heater (not shown). Further, the curing agent 130B in the curing-agent tank 1111 is supplied to the quantitative mixing unit 1130 through a curing-agent supply pipe 1123 having a heater (not shown). The quantitative mixing unit 1130 mixes the main component 130A and the curing agent 130B with a preset mixing ratio, and sends the mixed Silicone Resin 130 while performing measuring. The Silicone Resin 130 mixed in the quantitative mixing unit 1130 is sent to the injection nozzles 1152 of the vacuum chamber 1150 through a mixed-resin supply pipe 1125, and is injected from the injection nozzles 1152 into the switching modules 102.

An amount of the Silicone Resin 130 to be injected from the injection nozzles 1152 into the switching modules 102 can be measured by the quantitative mixing unit 1130. Therefore, it is possible to inject a set amount of Silicone Resin 130 into the switching modules 102 by closing valves 1151 on the basis of the measurement value of the quantitative mixing unit 1130. The mixed-resin supply pipe 1125 branches to be connected to the plurality of injection nozzles 1152, and the branch pipe lines have the valves 1151 for every injection nozzles 1152. The valves 1151 are closed in a case of increasing the degree of vacuum of the inside of the vacuum chamber 1150. Therefore, for example, after injection of the Silicone Resin 130, it is possible to sufficiently depressurize the inside of the vacuum chamber 1150 by the vacuum pump 1135.

The main-component tank 1101 and the curing-agent tank 1111 are connected to vacuum pumps (not shown), such that the insides of the tanks can be depressurized by the vacuum pumps. Therefore, in the injection apparatus 1100, the entire system in which the main component 130A, the curing agent 130B, and the mixed Silicone Resin 130 flow can be depressurized, and injection can be performed in the depressurized vacuum chamber 1150 (vacuum injection). This vacuum injection can be performed to inject the Silicone Resin 130 into the switching modules 102 in a state in which it is difficult for air bubbles to rise.

The injection apparatus 1100 shown in FIG. 5 can be used to perform a method of manufacturing the above-mentioned switching device 101. In the injection process, the switching modules 102 are put in the vacuum chamber 1150, the valves 1151 are opened such that the mixed Silicone Resin 130 is supplied to the injection nozzles 1152, and the Silicone Resin 130 is injected into the switching modules 102 from above by the injection nozzles 1152. In a case of performing the vacuum injection, the valve 1136 is opened, and the atmospheric pressure of the inside of the vacuum chamber 1150 is reduced up to a predetermined pressure by the vacuum pump 1135. After the set amount of Silicone Resin 130 is injected from the injection nozzles 1152 into the switching modules 102, the valves 1151 are closed, thereby completing the injection process.

In the depressurizing process, the inside of the vacuum chamber 1150 is depressurized up to a predetermined degree of vacuum by the vacuum pump 1135, and the predetermined degree of vacuum is maintained for a predetermined time period. Then, the hardening process is performed. In the hardening process, the temperature of the inside of the vacuum chamber 1150 is adjusted to a predetermined temperature by the heater (not shown) of the vacuum chamber 1150. Further, the degree of vacuum of the inside of the vacuum chamber 1150 is adjusted by the vacuum pump 1135. For example, in a case of adjusting the inside of the vacuum chamber 1150 to the normal pressure, simultaneously with stop of the vacuum pump 1135, the valve 1136 is closed and a leak valve (not shown) is opened, such that the atmospheric pressure of the inside of the vacuum chamber 1150 gradually returns to the atmosphere pressure.

As described above, the switching device 101 according to the first exemplary embodiment of the present invention is manufactured by putting the semiconductor device 111 that is an electronic component in the case 110, bonding the wire 119 to the semiconductor device 111 and the external terminal 114, injecting an amount of Silicone Resin 130 for sealing into the case 110 up to a predetermined height to cover the bonding surfaces 121 and 122 to which the wire 119 has been bonded and expose a portion of the wire 119 from the top surface of the Silicone Resin 130, leaving the case 110 under reduced pressure so as to raise the liquid surface of the Silicone Resin 130 such that the Silicone Resin 130 is attached to the portion of the wire 119 exposed from the top surface of the Silicone Resin 130 so as to cover the wire 119. In other words, the above-mentioned method of manufacturing the switching device 101 includes the injection process of injecting the Silicone Resin 130 into the case 110, and the depressurizing process of leaving the case 110 into which the Silicone Resin 130 has been injected in the injection process, under reduced pressure. In the injection process, an amount of Silicone Resin 130 is injected up to the predetermined height such that at least a portion of the metal wire is exposed from the top surface of the Silicone Resin 130. In the depressurizing process, the liquid surface of the Silicone Resin 130 is raised by depressurizing, such that the portion of the metal wire exposed from the top surface of the Silicone Resin 130 is covered with the Silicone Resin 130.

According to this method, it is possible to manufacture the switching device 101 in which the electronic component having been bonded with the metal wire by the wire bonding is in the case 110, the bonding surfaces 121 and 122 are covered with the Silicone Resin 130 injected in the case 110, and the metal wire is exposed from the top surface of the Silicone Resin 130, such that it is difficult for vibration of the Silicone Resin 130 to be transferred to the metal wire. As for the metal wire, since the liquid surface of the Silicone Resin 130 is raised in the depressurizing process, it is possible to attach the Silicone Resin 130 to the portion of the metal wire exposed from the top surface of the Silicone Resin 130 such that the exposed portion of the metal wire is covered with the Silicone Resin 130, without injecting the Silicone Resin 130 such that the entire metal wire is soaked. Therefore, it is possible to cover the bonding surfaces 121 and 122 of the switching device 101 with the Silicone Resin 130 and expose the metal wire from the top surface of the Silicone Resin 130, such that vibration of the Silicone Resin 130 is prevented from being transferred to the metal wire, and to cover the metal wire with the Silicone Resin 130, without introduction of new equipment or an increase in the size of the switching device 101. Further, in the depressurizing process, while the case 110 having the injected Silicone Resin 130 is left under the reduced pressure, degassing is performed to remove the air bubbles and moisture in the case 110. Therefore, it is possible to reduce the number of processes. Furthermore, in the switching device 101, the bonding surfaces 121 and 122 are covered and protected by the Silicone Resin 130, and it is difficult for vibration of the Silicone Resin 130 to be transferred to the wire 119. Moreover, since the wire 119 is covered with the Silicone Resin 130, the corrosion resistance of the wire 119 is improved and the insulation of the wire 119 is protected.

In the above-mentioned manufacturing method, both ends of the wire 119 are bonded to the bonding surfaces 121 and 122 such that the wire 119 is upwardly convex, and in the injection process, the Silicone Resin 130 is injected up to the height at which at least the apex portion of the wire 119 is exposed from the top surface of the injected Silicone Resin 130, and all the bonding surfaces 121 and 122 are covered by the injected Silicone Resin 130. Therefore, it is possible to more reliably cover the bonding surfaces 121 and 122 with the Silicone Resin 130.

In the above-mentioned first exemplary embodiment, the structure obtained by making the Silicone Resin 130 injected by the injection nozzles 1152 inflate in the depressurizing process so as to attach the Silicone Resin 130 to the entire wire 119 has been described as an example. However, the present invention is not limited thereto. When the Silicone Resin 130 is dropped into the switching module 102, the Silicone Resin 130 may be attached to the entire wire 119. This case will be described below as a second exemplary embodiment.

[Second Exemplary Embodiment]

Figure 6:
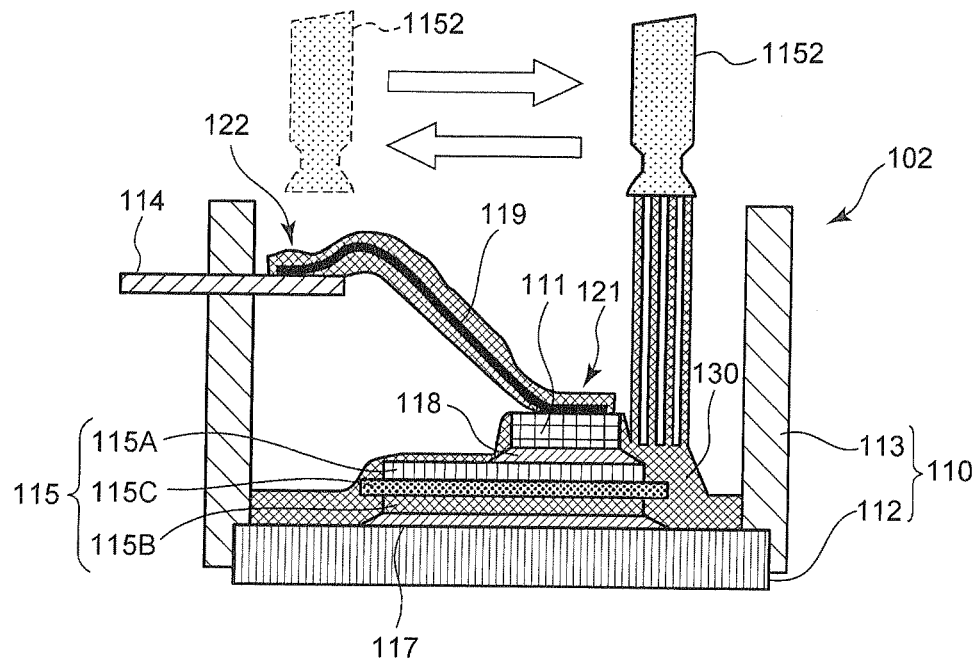
FIG. 6 is an explanatory view of an injection process of a method of manufacturing a switching device according to a second exemplary embodiment.
Figure 7:
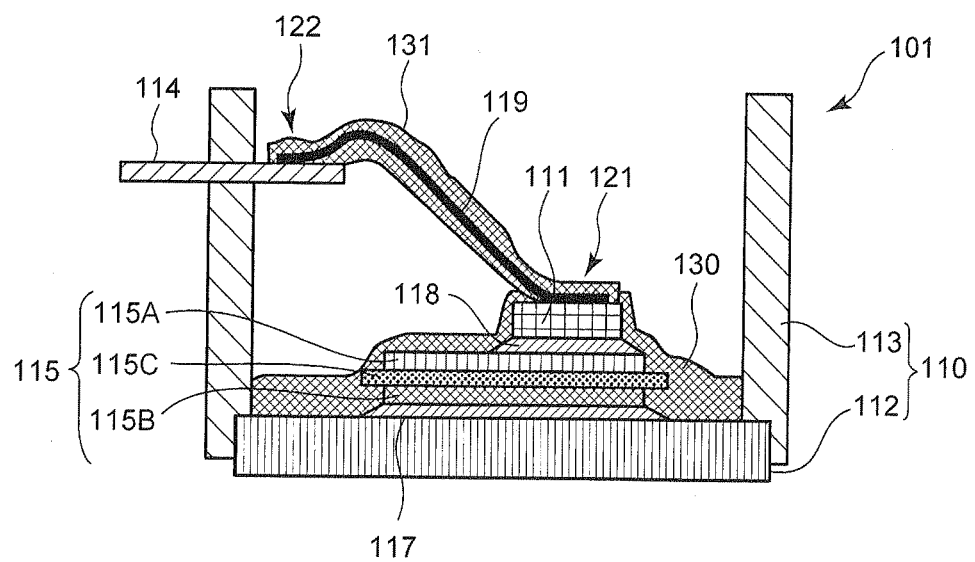
FIG. 7 is a main-part cross-sectional view illustrating a structure of a switching device according to the second exemplary embodiment.

FIG. 6 is an explanatory view of a method of manufacturing a switching device according to a second exemplary embodiment of the present invention, and particularly shows an injection process. FIG. 7 is a main-part cross-sectional view illustrating a structure of a switching device 101A that is manufactured by the manufacturing method shown in FIG. 6. In this second exemplary embodiment, parts configured in the same way as the above-mentioned first exemplary embodiment are denoted by the same reference symbols, and the redundant description will not be repeated.

In the second exemplary embodiment, a transfer mechanism is provided to transfer the injection nozzles 1152 for dropping the Silicone Resin 130 from above the switching modules 102, horizontally above the switching modules 102, such that the injection nozzles 1152 are movable. The transfer direction of the injection nozzles 1152 may be one direction, desirably, two or more directions, and it is preferable to transfer the injection nozzles 1152 to an arbitrary position above the switching modules 102. The injection nozzles 1152 are transferred above the switching modules 102, as shown by arrows in FIG. 6, while dropping the Silicone Resin 130 into the switching modules 102, such that the Silicone Resin 130 falls on the substrate 115 and the semiconductor device 111 arranged in each case 110. Further, the Silicone Resin 130 falls on not only the bonding surfaces 121 and 122 but also the entire wire 119 including the apex portion.

At a fore end of each injection nozzle 1152, a nozzle header 1154 for dispersively dropping the Silicone Resin 130 is provided. Therefore, it is possible to drop the Silicone Resin 130 in a belt shape or a bundle shape over a wider area. Therefore, it is possible to adjust a transfer range of the injection nozzle 1152, such that the Silicone Resin 130 is dropped to spread all over the inside of the housing 113 without any gap, for example. Also, at a position where a plurality of members vertically overlaps, for example, below the wire 119, if the injection nozzle 1152 is kept for a predetermined time period, or the movement speed of the injection nozzle 1152 is reduced, it is possible to sufficiently spread the Silicone Resin 130 even all over a lower member.

The transfer path of the injection nozzle 1152 may be set such that the nozzle header 1154 passes all around the inside of the housing 113. Alternatively, the path may be set such that the nozzle header 1154 passes only above a limited place, for example, above the wire 119 or the bonding surfaces 121 and 122, a plurality of times.

After the Silicone Resin 130 is injected into the switching module 102 by the injection process shown in FIG. 6, if a depressurizing process and a hardening process are performed under the same conditions as those in the first exemplary embodiment, the Silicone Resin 130 attached to the wire 119, the bonding surfaces 121 and 122, and other components in the housing 113 hardens, whereby the switching device 101A is obtained. If the Silicone Resin 130 is spread by the nozzle header 1154, it becomes easy for air bubbles to come into the Silicone Resin 130. However, since the depressurizing process is performed thereafter for degassing, the use of the nozzle header 1154 does not cause any demerits.

In the switching device 101A shown in FIG. 7, the Silicone Resin 130 covers the semiconductor device 111, the substrate 115, and an entire surface of a portion of the external terminal 114 contained in the case 110, and the coating resin film 131 is formed on the entire wire 119. The amount of Silicone Resin 130 injected into the case 110 is preferably set such that the liquid surface of the Silicone Resin 130 is at a height at which at least a portion of the wire 119 is exposed. This is for making it difficult for vibration of the Silicone Resin 130 to be transferred to the wire 119 in the switching device 101A after the Silicone Resin 130 hardens. In the switching device 101A shown in FIG. 7, the Silicone Resin has been injected up to a height to cover the substrate 115 fixed to the bottom of the case 110. The liquid surface of the Silicone Resin 130 is considerably lower than the apex portion of the wire 119, and is also lower than the bonding surfaces 121 and 122. Therefore, in a case where vibration is applied to the switching device 101A, even though the gelatinous Silicone Resin 130 vibrates, there is no concern that a load of the vibration might be applied to the wire 119 or break the wire 119.

As described above, the manufacturing method of the second exemplary embodiment includes the injection process of dropping (injecting) the Silicone Resin 130 into the switching module 102 by the injection nozzle 1152. In this injection process, the injection nozzle 1152 is transferred to pass above the wire 119 and the bonding surfaces 121 and 122 and drops the Silicone Resin 130 onto the individual parts contained in the case 110 from above. Therefore, the bonding surfaces 121 and 122 of the switching device 101A are covered with the Silicone Resin 130 and the wire 119 is exposed from the top surface of the Silicone Resin 130, such that it is possible to prevent vibration from being transferred to the wire 119, and the wire 119 is covered with the coating resin film 131 such that it is possible to improve the insulation property and the corrosion resistance. Further, since a small amount of Silicone Resin 130 is injected into the case 110, the decrease in the amount of used material results in a decrease in cost, a decrease in the degassing time period in the depressurizing process, and a decrease in the hardening time period of the Silicone Resin 130 in the hardening process. Therefore, it is possible to reduce the lead time.

Further, in the second exemplary embodiment, it is not necessarily required to suppress the amount of Silicone Resin 130 that is injected into the case 110, to a small amount as shown in FIG. 7. For example, the Silicone Resin 130 may be injected to the height LH such that the bonding surfaces 121 and 122 are completely soaked in the Silicone Resin 130, as shown in FIG. 2. In this case, the bonding surfaces 121 and 122 are more reliably covered with the Silicone Resin 130, and the entire wire 119 is covered with the Silicone Resin 130. After the Silicone Resin 130 hardens, the apex portion of the wire 119 and the vicinity thereof are exposed from the top surface of the Silicone Resin 130. Therefore, in the case where vibration is applied to the switching device 101A, even though the gelatinous Silicone Resin 130 vibrates, there is no concern that a load of the vibration might be applied to the wire 119 or break the wire 119.

[Third Exemplary Embodiment]

Figure 8:
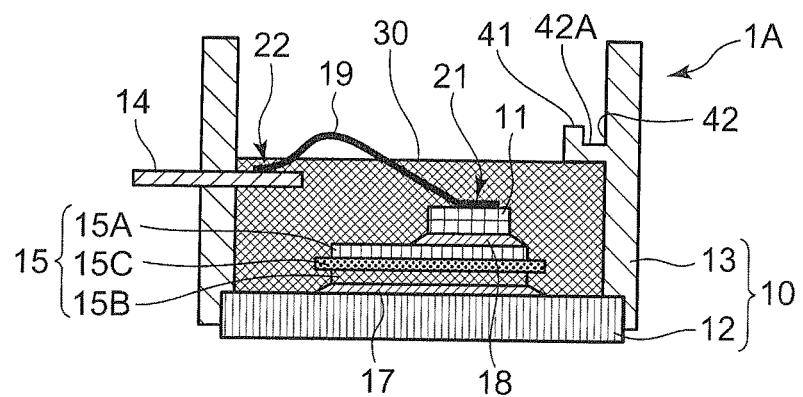
FIG. 8 is an explanatory view of an injection process of a method of manufacturing a switching module according to a third exemplary embodiment.
Figure 9:
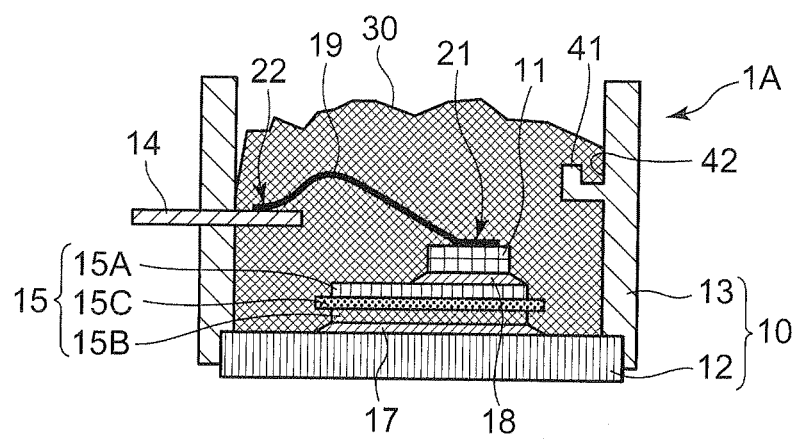
FIG. 9 is an explanatory view of a depressurizing process of the method of manufacturing a switching module.
Figure 10:
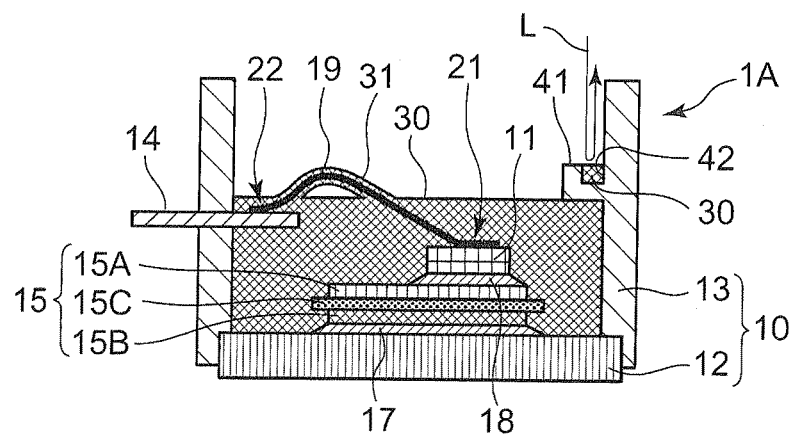
FIG. 10 is an explanatory view of a detection process of the method of manufacturing a switching module.
Figure 11:
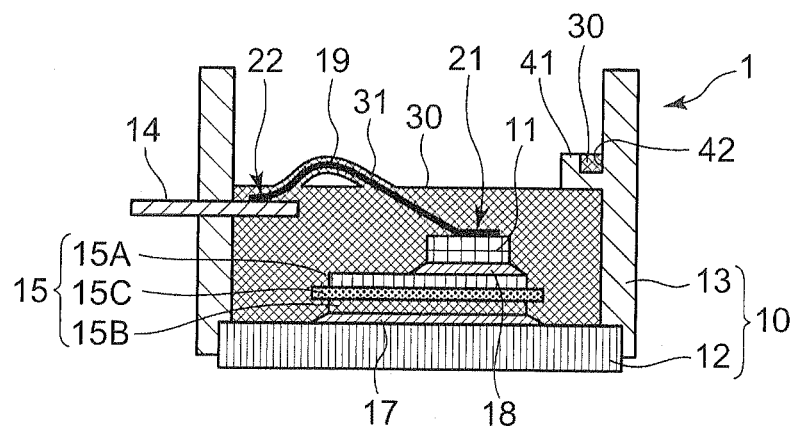
FIG. 11 is a main-part cross-sectional view of a switching device according to the third exemplary embodiment.

FIGS. 8 to 10 are explanatory views illustrating a method of manufacturing a switching device 1 according to a third exemplary embodiment of the present invention. More specifically, FIG. 8 is a main-part cross-sectional view of a switching module 1A after an injection process, and FIG. 9 is a main-part cross-sectional view of the switching module 1A in a depressurizing process. Further, FIG. 10 is a main-part cross-sectional view of the switching module 1A in a detection process. Also, FIG. 11 is a main-part cross-sectional view illustrating a structure of the switching device 1 that is manufactured by the manufacturing method according to the third exemplary embodiment.

The switching device 1 (FIG. 11) according to the third exemplary embodiment is configured by putting a substrate 15 having a semiconductor device 11 mounted thereon, in a case 10 having an opening provided at an upper face. The semiconductor device 11 is an electronic device and is a switching device for power supply corresponding to high current, such as an IGBT, a power MOSFET, a thyristor, or a diode. The substrate 15 is a triple-layered substrate that is formed by bonding an upper insulating substrate 15A, a lower insulating substrate 15B, and an insulating substrate 15C interposed there between by a brazing material. On the upper insulating substrate 15A and the lower insulating substrate 15B, for example, circuit patterns constituting a power supply circuit are formed. The semiconductor device 11 is electrically connected to the patterns formed on the upper insulating substrate 15A and the lower insulating substrate 15B by solder 18.

The case 10 includes a base 12 that constitutes a bottom, and a housing 13 that is fixed to the circumferential edge portion of the base 12 and constitutes a side wall. A cross-section shape of the housing 13 may be a circle, a square, or other polygons. In the third exemplary embodiment, the housing 113 is almost cylindrical, for example. The housing 13 and the base 12 are bonded to each other by an adhesive, so as to prevent a liquid from being leaked. Therefore, in a case where a liquid is filled in the case 10, it is possible to store the liquid without leakage. On an upper surface of the base 12, a lower portion of the substrate 15 is fixed by an insulating bonding material 17. In the housing 13, an external terminal 14 is provided to protrude outward from the case 10. The external terminal 14 is a metal terminal that penetrates the housing 13 to extend over the inside and outside of the case 10, and to be connected to a circuit on the outside of the case 10. The external terminal 14 is provided for connecting the semiconductor device 11 contained in the case 10 to a circuit on the outside of the case 10, and in the case 10, the external terminal 14 and the semiconductor device 11 are electrically connected to each other by a wire 19 (metal wire).

The wire 19 is a metal wire formed by wire bonding, specifically, a wire that is made of gold or aluminum and has a thickness of several μm to several hundreds μm. One end of the wire 19 is bonded to a metal portion of an external connection terminal (not shown) of the semiconductor device 11 by a load and an ultrasonic wave, and the other end of the wire 19 is bonded to the external terminal 14 in the same way, such that the external connection terminal and the external terminal 14 are electrically connected to each other through the wire 19. Here, a portion (surface) of the semiconductor device 11 bonded to the wire 19 is referred to as a bonding surface 21, and a portion (surface) of the external terminal 14 is referred to as a bonding surface 22. Immediately after the wire 19 is formed by wire bonding, the wire 19 and the metals of the bonding surfaces 21 and 22 are exposed to the atmosphere. Further, the wire 19 is formed such that both ends bonded to the bonding surfaces 21 and 22 are lowest and the center portion is upwardly convex (the highest portion of the wire 19 is positioned between the both ends bonded to the bonding surfaces 21 and 22). As described above, the semiconductor device 11 is put in the case 10, the substrate 15 is bonded to the base 12 by the bonding material 17, and the wire 19 is formed between the external terminal 14 and the semiconductor device 11 mounted on the substrate 15, whereby the switching module 1A is configured. Silicone Resin is injected into the switching module 1A, so as to cover the bonding surfaces 21 and 22 and the wire 19, thereby manufacturing the switching device 1 as an electronic device.

A method of manufacturing the switching device 1 from the switching module 1A includes the following four processes.

1. An injection process of injecting the Silicone Resin into the switching module 1A
2. A depressurizing process of leaving the switching module 1A having the injected Silicone Resin under reduced pressure
3. A detection process of detecting that the wire 19 has been covered with the Silicone Resin
4. A hardening process of hardening the Silicone Resin The Silicone Resin injected into the case 10 may be a two-component resin made by mixing a curing agent with a base component, and has a predetermined degree of viscosity and mobility during injection and then hardens under predetermined hardening conditions so as to be a gel state or solid. Examples of the hardening condition for the Silicone Resin 30 include light (ultra violet light) irradiation, heating, and so on. Typical hardening conditions for thermosetting Silicone Resin having a temperature and a time period as hardening conditions include a temperature of room temperature (20° C.±15° C. according to Japanese Industry Standards) to 150° C. and a time period of about several minutes to 3 hours. In the third exemplary embodiment, an example using the thermosetting Silicone Resin 30 (FIGS. 9 to 12) that hardens under conditions of 80° C. and 1 hour will be described.

FIG. 8 shows a state of the switching module 1A after the Silicone Resin 30 has been injected into the case 10 in the injection process. In the injection process, for example, the fluid Silicone Resin 30 is prepared by mixing a two-component resin composed of a main component and a curing agent, and an injection apparatus (not shown) for discharging the Silicone Resin 30 from an injection nozzle (not shown) is used. In the injection process, the Silicone Resin 30 is injected into the case 10 of the switching module 1A from above, by the injection nozzle of the injection apparatus. An injection amount of the Silicone Resin 30 is determined such that the height of the liquid surface of the Silicone Resin 30 is sufficiently lower than the uppermost portion (wire top) of the wire 19 and the metals of the bonding surfaces 21 and 22 are soaked in the Silicone Resin 30, as shown in FIG. 8. If the Silicone Resin 30 is injected up to a height shown in FIG. 8, the corrosion resistance and moisture-proof property of the bonding surfaces 21 and 22 are secured, and in a case where the Silicone Resin 30 vibrates, there is no concern that the vibration might be transferred to the wire 19 so as to cause breaking of the wire 19 and the bonding surfaces 21 and 22, unlike a case where the entire wire 19 is soaked in the Silicone Resin 30.

As shown in FIG. 8, a resin receiving portion 41 is provided in the inner surface of the housing 13 constituting the case 10. The resin receiving portion 41 is a protrusion-shaped portion that protrudes from the housing 13 into the internal space of the case 10, and includes a resin pool 42 that is a recess portion capable of storing the Silicone Resin 30. The height of the edge of the resin pool 42 is almost the same as that of the wire top (the apex portion of the convex shape of the wire 19 having the upwardly convex center portion as described above) or is higher than the wire top. In the depressurizing process to be described below, if the liquid surface of the Silicone Resin 30 rises beyond the edge of the resin pool 42, the Silicone Resin 30 flows into the resin pool 42.

The injection amount of the Silicone Resin 30 in the injection process is determined on the basis of the height of the liquid surface after injection. In other words, the injection amount of the Silicone Resin 30 is determined such that the liquid surface of the Silicone Resin 30 is at the height to soak the bonding surfaces 21 and 22 and expose a portion of the wire 19 as described above. Further, as shown in FIG. 8, the resin receiving portion 41 projecting from the housing 13 has a lower edge which is at the same height as that of the liquid surface of the Silicone Resin 30 injected in the injection process. Therefore, in the injection process, if the Silicone Resin 30 is injected while being observed until the liquid surface of the Silicone Resin 30 is in contact with the lower edge of the resin receiving portion 41, it is possible to adjust the injection amount of the Silicone Resin 30 to an appropriate amount, without measuring the Silicone Resin 30 during injection or before injection.

The injection process may be performed under normal pressure or may be performed under reduced pressure. In other words, when the Silicone Resin 30 is injected into the switching module 1A, the entire switching module 102 and a nozzle (not shown) for injecting the Silicone Resin 30 may be put in a chamber for depressurizing (not shown), and the inside of the chamber for depressurizing may be depressurized, and injection of the Silicone Resin 30 (so-called vacuum injection) may be performed. If the vacuum injection is performed, there are advantages such as an advantage that it is possible to quickly inject the Silicone Resin 30.

After the Silicone Resin 30 is injected into the case 10, the depressurizing process is performed. In the depressurizing process, the switching module 1A is left in a depressurized environment for a predetermined period. Specifically, the switching module 1A having the injected Silicone Resin 30 is put in an airtightly closable chamber for depressurizing, and the degree of vacuum of the inside of the chamber for depressurizing is maintained at 600 Pa to 1000 Pa for about 10 minutes to 1 hour. Further, in a case where the above-mentioned vacuum injection is performed in the injection process, after the injection of the Silicone Resin 30 is completed, the depressurizing process is performed. In the depressurizing process, the switching module 1A is continuously left in the depressurized environment. In this case, the leaving time period is about 10 minutes to 1 hour as described above. Also, in this case, the degree of vacuum of the inside of the chamber containing the switching module 1A in the depressurizing process may be higher than that in the injection process (the pressure of the inside of the chamber in the depressurizing process may be lower than that in the injection process), or may be the same as that in the injection process.

The time period when the switching module 1A is left in the depressurizing process is not particularly limited as long as degassing can be sufficiently performed. Therefore, it is preferable to determine the time period on the basis of the degree of viscosity of the Silicone Resin 30, the amount of air present in the components including the Silicone Resin 30 inside the case 10, the degree of vacuum in the depressurizing process, a transition speed from the normal pressure to a target degree of vacuum in the depressurizing process, and so on. In general, as the degree of vacuum increases and the time period lengthens, the degassing can be performed more reliably. Therefore, it is preferable to determine the degree of vacuum and the time period, considering a degassed state and productivity.

In the depressurizing process, air below the semiconductor device 11 of the switching module 1A and in gaps such as a gap between the substrate 15 and the base 12 is expanded to form air bubbles by depressurizing, and the air bubbles come up in the Silicone Resin 30. Since the expanded air bubbles come up in the Silicone Resin 30 from the vicinity of the lower portion of the case 10, the Silicone Resin 30 foams and inflates all over, such that the liquid surface of the Silicone Resin 30 rises as shown in FIG. 9. In this state shown in FIG. 9, the liquid surface of the Silicone Resin 130 exceeds the height of the wire top, such that the apex portion of the wire 19 exposed from the top surface of the Silicone Resin 30 in the injection process soaks in the Silicone Resin 30. Further, in the depressurizing process, since the liquid surface of the Silicone Resin 30 exceeds the height of the highest portion of the wire 19, the Silicone Resin 30 passes over the edge of the resin pool 42 so as to flow into the resin pool 42.

In a state in which the switching module 1A is placed under the reduced pressure, as time goes on, the air existing in the gaps in the case 10 comes out from the Silicone Resin 30, the inflating of the air bubbles lessens. Therefore, the liquid surface of the Silicone Resin 30 lowers to the height according to the amount injected in the injection process. However, since the Silicone Resin 30 has high viscosity, even after the liquid surface of the Silicone Resin 30 returns to the injected height, the Silicone Resin 30 attached to a surface of a portion having soaked in the Silicone Resin 30 once remains as a coating film. On the basis of the viscosity of general Silicone Resin, it is apparent that the coating film remains for several hours to several tens of hours. In the depressurizing process, since the Silicone Resin 30 inflates up to the height of the wire top, a coating film is made of the Silicone Resin 30 all over the wire 19.

The inflating height of the Silicone Resin 30 in the depressurizing process depends on the degree of viscosity of the Silicone Resin 30, the amount of air present in the components including the Silicone Resin 30 inside the case 10, the degree of vacuum in the depressurizing process, a transition speed from the normal pressure to a target degree of vacuum in the depressurizing process, and so on. Further, the amount of air present in the gaps between the components depends on the size of the substrate 15, the number of elements mounted on the substrate 15, the number of wires 19, and so on. Therefore, considering them, the amount of Silicone Resin 30 to be injected in the injection process, that is, the height of the liquid surface is determined such that the Silicone Resin 30 inflates up to the position of the wire top in the depressurizing process.

However, since there is actually a variation in the inflating height of the Silicone Resin 30, it is preferable to determine whether the liquid surface has actually risen beyond the wire top such that the Silicone Resin 30 has been attached to the wire 19. Particularly, if the determining is performed before the hardening process of the method of manufacturing the switching device 1, for example, in a case where it is determined that the Silicone Resin 30 has been insufficiently attached to the wire 19, it is possible to attach the Silicone Resin 30 to the wire 19 by the shortage amount. For this reason, in the third exemplary embodiment, after the depressurizing process, the detection process is performed for determining whether the liquid surface of the Silicone Resin 30 has risen up to a required height. This detection process may be performed after the depressurizing on the chamber for depressurizing containing the switching module 1A is released, or may be preformed when the switching module 1A is under the reduced pressure, that is, before the degree of vacuum of the inside of the chamber for depressurizing is reduced.

If the liquid surface of the Silicone Resin 30 rises beyond the wire top as shown in FIG. 9, the Silicone Resin 30 flows into the resin pool 42. In this case, as shown in FIG. 10, even after the liquid surface of the Silicone Resin 30 having inflated in the depressurizing process lowers by degassing, the Silicone Resin 30 accumulated in the resin pool 42 is not discharged but remains. Therefore, in the detection process shown in FIG. 10, the Silicone Resin 30 accumulated in the resin pool 42 is detected, thereby determining whether the liquid surface of the Silicone Resin 30 has exceeded the height of the wire top, that is, the wire 19 has been covered with the Silicone Resin 30 in the depressurizing process.

In the detection process, as shown in FIG. 10, a light source for inspection (not shown) such as a laser light source or a LED light source irradiates inspection light L from above the case 10, the inspection light L is reflected at the resin pool 42, and a light receiving unit (not shown) receives the reflected light and determines whether the Silicone Resin 30 remains in the resin pool 42, on the basis of the amount of received light, the wavelength of the received reflected light, and so on. Prior to the detection process, with respect to reflected light in a case of irradiating the inspection light L onto a bottom surface 42A (FIG. 8) of the resin pool 42 and reflected light in a case of irradiating the inspection light L onto the Silicone Resin 30 accumulated in the resin pool 42, a difference in the amount of received light of the light receiving unit, a difference in the wavelength component of the received reflected light, and the like are obtained. On the basis of these differences, it is possible to reliably perform the determination in the detection process.

As specific examples, the wavelength of the inspection light L may be in any one of a visible range, an ultra violet range, and an infrared range. If the inspection light L has a wavelength which is easily absorbed by the Silicone Resin 30, in a case where the Silicone Resin 30 remains in the resin pool 42, the amount of reflected light is remarkably reduced, it becomes easy to reliably determine existence or non-existence of the Silicone Resin 30. In other words, if the wavelength of the inspection light L is set to a wavelength of an absorption peak present in an absorption spectrum of the Silicone Resin 30, it is possible to reliably detect the Silicone Resin 30. In this case, it is preferable that the bottom surface 42A should reflect the inspection light L with high reflectance. In contrast, it is also possible to use the inspection light L that is reflected by the Silicone Resin 30 with high reflectance In this case, if the bottom surface 42A rarely reflects the inspection light L, since the differences in the reflected light becomes noticeable, it is possible to more reliably detect the Silicone Resin 30.

As described above, in the detection process, it is possible to detect that the Silicone Resin 30 remains in the resin pool 42 by irradiating the inspection light L from above the switching module 1A, and on the basis of the detection result, it is possible to determine whether the Silicone Resin 30 has been attached to the entire wire 19. In a case where it is determined in the detection process that the Silicone Resin 30 has been attached to the entire wire 19, the hardening process is performed.

The Silicone Resin 30 injected into the switching module 1A contains the curing agent mixed therein. In the hardening process, the switching module 1A is left in an environment satisfying the hardening conditions for the Silicone Resin 30 for a predetermined time period. For example, in a case of using thermosetting Silicone Resin, the switching module 1A is left in a state in which a predetermined temperature or higher temperature (the room temperature to 150° C.) is maintained. In a case of using photo-curable Silicone Resin, light is irradiated by an ultra violet light ramp (not shown). In the third exemplary embodiment, as described above, the switching module 1A is left at 80° C. for 1 hour until the Silicone Resin 30 hardens. Since the coating film of the Silicone Resin 30 formed on the wire 19 as described above is maintained for a long time due to the viscosity of the Silicone Resin 30, in the hardening process, the coating film becomes a gel state or solid. Therefore, the wire 19 is covered with the coating film of the Silicone Resin 30 having lost the mobility. In the hardening process, the switching module 1A may be placed under the reduced pressure, continuously to the depressurizing process, or the degree of vacuum may gradually decrease up to the normal pressure. The hardening process may be performed after the normal pressure is achieved.

FIG. 11 is a main-part cross-sectional view illustrating a structure of the switching device 1 that is manufactured by the above-mentioned manufacturing method. In the case 10 of the switching device 1, the Silicone Resin 30 has been filled up to the height to cover both of the bonding surfaces 21 and 22, and has hardened in a gel state, and a portion of the wire 19 has been exposed from the top surface of the Silicone Resin 130. The wire 19 is covered with the Silicone Resin 30 at the bonding surfaces 21 and 22. Further, the portion of the wire 19 exposed from the top surface of the Silicone Resin 30 is covered by a coating resin film 31 that is a thin film of the attached Silicone Resin 30 in the depressurizing process. It is easily determined in the detection process whether the coating resin film 31 has been formed over all the wire 19 up to the wire top, on the basis of whether the Silicone Resin 30 in the resin pool 42 has been detected. Therefore, in a case where the liquid surface of the Silicone Resin 30 does not rise up to the wire top in the depressurizing process, such that the entire wire 19 is not covered with the Silicone Resin 30, this can be detected in the detection process. Accordingly, it is possible to reliably detect product defects. Further, since the detection process is performed before the hardening process, if it is detected that the switching module 1A is defective, the switching module 1A can be corrected by attaching the Silicone Resin 30 to the wire 19.

As described above, the switching device 1 according to the third exemplary embodiment of the present invention is configured by bonding the wire 19 to the semiconductor device 11 by the wire bonding, and covering the bonding surfaces 21 and 22, to which the wire 19 has been bonded, with Silicone Resin 30 for sealing, and includes the case 10 that accommodates the semiconductor device 11 and into which the Silicone Resin 30 is injected. In the case 10, the resin receiving portion 41 is provided to allow the Silicone Resin 30 to flow therein in a case where the liquid surface of the injected Silicone Resin 30 becomes higher than the wire 19. The switching device 1 is manufactured by putting the semiconductor device 11 in the case 10, injecting an amount of Silicone Resin 30 into the case 10 up to a predetermined height to expose a portion of the wire 19 from the top surface of the Silicone Resin 30, leaving the case 10 under the reduced pressure so as to raise the liquid surface of the Silicone Resin 30 such that the Silicone Resin 30 is attached to the portion of the wire 19 exposed from the Silicone Resin 30 so as to cover the wire 19. Therefore, it is possible to cover the wire 19 with the Silicone Resin 30, without performing work for sucking and removing the Silicone Resin 30 injected once, or the like.

Further, in a case where the liquid surface of the Silicone Resin 30 reaches the height to cover the wire 19 in the depressurizing process, the Silicone Resin 30 flows into the resin receiving portion 41. The Silicone Resin 30 having flowed into the resin receiving portion 41 can be easily detected by an optical method using the inspection light L. Therefore, it is possible to easily confirm that the wire 19 has been covered with the Silicone Resin 30 up to the uppermost portion. Therefore, it is possible to provide the switching device 1 that can improve the corrosion resistance of the wire 19 and protect the insulation of the wire 19 by covering the wire 19 with the Silicone Resin 30, and be manufactured without introduction of new equipment including a nozzle for suction or an increase in the size of the switching device 1, and allow to easily determine whether the wire 19 has completely been covered.

Further, in the method of manufacturing the switching device 1 including the injection process, the depressurizing process, the detection process, and the hardening process as described above, in the depressurizing process, the liquid surface of the Silicone Resin 30 is raised such that the wire 19 is covered with the Silicone Resin 30, and in the detection process, it is detected that the liquid surface of the Silicone Resin 30 has risen up to a sufficient height. Accordingly, it is possible to reliably cover the wire 19 with the Silicone Resin 30 and to easily confirm that the wire 19 has been covered. Therefore, it is possible to quickly manufacture the switching device 1 at a high yield rate, without leaving a state in which the covering of the wire 19 is incomplete.

Further, in the switching device 1, the resin receiving portion 41 includes the resin pool 42 exposed to the internal space of the case 10, and the edge of the resin pool 42 is positioned at the same height as that of the upper edge of the wire 19. Therefore, in a case where the liquid surface of the Silicone Resin 30 rises beyond the wire 19, the Silicone Resin 30 surely flows into and is stored in the resin pool 42 of the resin receiving portion 41. Therefore, it is possible to easily and quickly detect that the wire 19 has been covered with the Silicone Resin 30 up to the top portion by detecting the Silicone Resin 30 remaining in the resin pool 42 after the rising of the liquid surface of the Silicone Resin 30 lessens. Further, since it is optically detected by irradiating the inspection light L whether the Silicone Resin 30 has flowed into the resin pool 42 of the resin receiving portion 41, it is possible to easily and quickly detect that the wire 19 has been covered with the Silicone Resin 30 up to the top portion, by a contactless method. Therefore, with respect to a number of switching devices 1, it is possible to consequently and quickly detect the Silicone Resin 30 in the resin pool 42. Moreover, it is also possible to perform the detection by irradiating the inspection light L in the chamber for depressurizing.

[Fourth Exemplary Embodiment]

Figure 12:
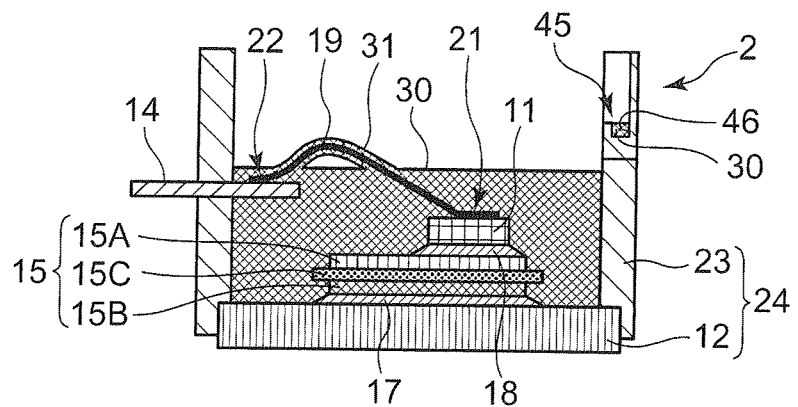
FIG. 12 is a main-part cross-sectional view of a switching device according to a fourth exemplary embodiment.

FIG. 12 is a main-part cross-sectional view illustrating a structure of a switching device 2 according to a fourth exemplary embodiment of the present invention. In the fourth exemplary embodiment, parts configured in the same way as the above-mentioned third exemplary embodiment are denoted by the same reference symbols, and the redundant description will not be repeated. Similarly to the switching device 1 described in the third exemplary embodiment, the switching device 2 is configured by putting the substrate 15 having the semiconductor device 11 mounted thereon, in a case 24, and connecting the external terminal 14 provided to the case 24 and the semiconductor device 11 by the wire 19. The case 24 of the switching device 2 is configured by bonding a housing 23 to the circumferential edge portion of a base 12. A cross-section shape of the housing 23 may be a circle, similarly to the housing 13, or may be a square, or other polygons. The housing 23 and the base 12 are bonded to each other by an adhesive, so as to prevent a liquid from being leaked. Therefore, in a case where a liquid is filled in the case 24, it is possible to store the liquid without leakage.

A portion of the housing 23 is cut, so as to form a resin receiving portion 45. The resin receiving portion 45 is formed by cutting a portion on the circumference of the upper edge portion of the inner surface of the housing 23, and in the bottom of the resin receiving portion 45, a resin pool 46 for storing the Silicone Resin 30 is formed. The resin pool 46 is a recess portion exposed to the internal space of the case 24, and the height of the edge of the resin pool 46 becomes almost the same as the wire top of the wire 19 (the apex portion of the convex shape of the wire 19 having the upwardly convex center portion as described above) or higher than the wire top. In the depressurizing process of the process of manufacturing the switching device 2, if the liquid surface of the Silicone Resin 30 rises beyond the edge of the resin pool 46, the Silicone Resin 30 flows into the resin pool 46.

The switching device 2 shown in FIG. 12 is manufactured by the same manufacturing method as that for the switching device 1 according to the third exemplary embodiment. That is, the manufacturing method includes an injection process of injecting the Silicone Resin 30 into the case 24 up to a predetermined height, a depressurizing process of leaving the case 24 under the reduced pressure after the injection process, so as to raise the liquid surface of the Silicone Resin 30 for degassing, a detection process of detecting that the liquid surface of the Silicone Resin 30 has risen in the depressurizing process, and a hardening process of hardening the Silicone Resin 30. The Silicone Resin 30 that is injected in the injection process is the same as that of the third exemplary embodiment, and the injection amount of the Silicone Resin 30 is set such that the bonding surfaces 21 and 22 are soaked in the Silicone Resin 30 and at least a portion of the wire 19 is exposed from the liquid surface of the Silicone Resin 30. In a state in which the Silicone Resin 30 has been injected up to that height, the resin receiving portion 45 is not in contact with the Silicone Resin 30, and thus the Silicone Resin 30 does not flow into the resin pool 46.

In the subsequently performed depressurizing process, in the case 24 under the reduced pressure, the Silicone Resin 30 is pushed up, together with air bubbles, such that the liquid surface of the Silicone Resin 30 rises beyond the height of the wire top of the wire 19. In this case, the Silicone Resin 30 is attached to the entire wire 19, and the Silicone Resin 30 flows into the resin pool 46 of the resin receiving portion 45. Next, while the case 10 is left under the reduced pressure or after the depressurized state is released, the detection process is performed.

Figure 13:
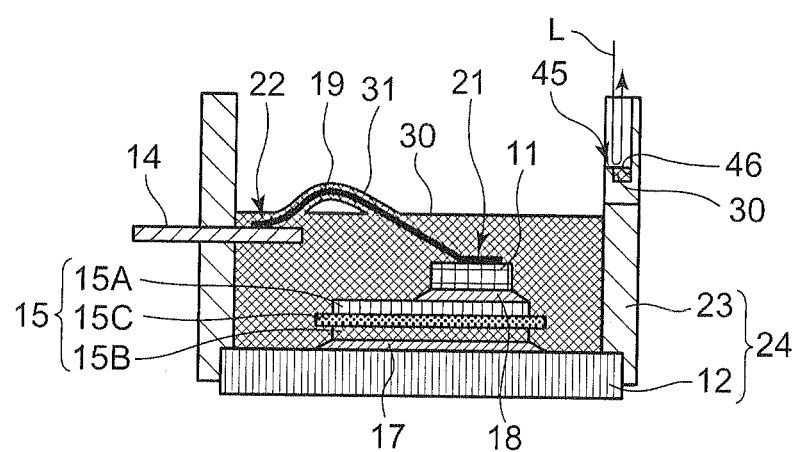
FIG. 13 is an explanatory view illustrating a detection process of a method of manufacturing a switching module according to the fourth exemplary embodiment.

FIG. 13 is an explanatory view of the detection process of the process of manufacturing the switching device 2. As shown in FIG. 13, in the detection process, a light source (not shown) irradiates the inspection light L from above the case 24 toward the resin pool 46. Since the inspection light L is reflected by the bottom surface of the resin pool 46 or the Silicone Resin 30 accumulated in the resin pool 46, the reflected light can be received by a light receiving unit (not shown), so as to detect the Silicone Resin 30 accumulated in the resin pool 46. The inspection light L is the same as the inspection light L described in the third exemplary embodiment As the inspection light L, light having a wavelength that is easily absorbed by the Silicone Resin 30 may be used in a structure in which the reflectance of the inspection light L at the bottom surface of the resin pool 46 is high, or light having a wavelength that is reflected by the surface of the Silicone Resin 30 with high reflectance may be used in a structure in which the reflectance of the bottom surface of the resin pool 46 is low.

As described above, the switching device 2 includes the case 24 configured by bonding the housing 23 to the base 12, the resin receiving portion 45 is formed by cutting a portion of the inner surface of the case 24, and the resin pool 46 capable of storing the Silicone Resin 30 is formed at the resin receiving portion 45. Therefore, in a case where the liquid surface of the Silicone Resin 30 rises beyond the height of the wire top of the wire 19 in the depressurizing process, the Silicone Resin 30 flows into the resin pool 46. The Silicone Resin 30 having flowed into the resin pool 46 can be easily detected in the detection process by an optical method irradiating the inspection light L. Therefore, it is possible to easily determine whether the Silicone Resin 30 has been attached to the entire wire 19 exposed from the top surface of the Silicone Resin 30 in the depressurizing process.

Further, in the switching device 2, since the resin receiving portion 45 is formed by cutting a portion of the housing 23, the resin receiving portion 45 does not protrude inside the case 24, and dose not interfere with the process of disposing the substrate 15 in the case 24 and the process of forming the wire 19. Therefore, it is possible to easily detect that the Silicone Resin 30 has been attached to the wire 19, without influencing the disposition of the components in the case 24 and other processes.

[Fifth Exemplary Embodiment]

Figure 14:
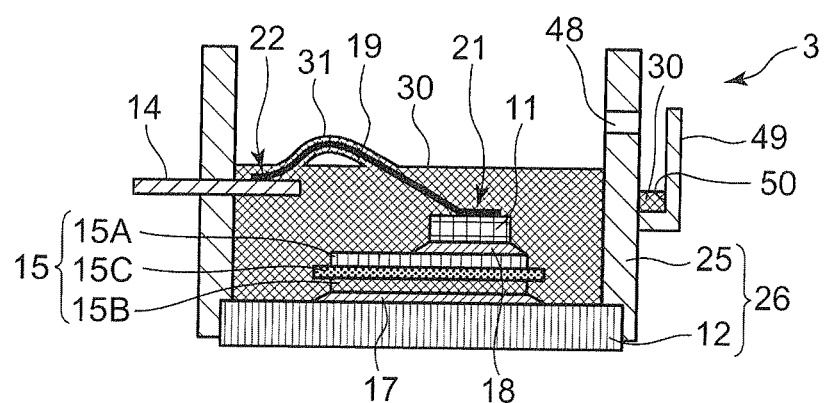
FIG. 14 is a main-part cross-sectional view of a switching device according to a fifth exemplary embodiment.

FIG. 14 is a main-part cross-sectional view illustrating a structure of a switching device 3 according to a fifth exemplary embodiment of the present invention. In the fifth exemplary embodiment, parts configured in the same way as the above-mentioned third exemplary embodiment are denoted by the same reference symbols, and the redundant description will not be repeated. Similarly to the switching device 1 described in the third exemplary embodiment, the switching device 3 is configured by putting a substrate 15 having a semiconductor device 11 mounted thereon, in a case 26, and connecting an external terminal 14 provided to the case 26 and the semiconductor device 11 by a wire 19. The case 26 of the switching device 3 is configured by bonding a housing 25 to the circumferential edge portion of a base 12. A cross-section shape of the housing 25 may be a circle, similarly to the housing 13, or may be a square, or other polygons. The housing 25 and the base 12 are bonded to each other by an adhesive, so as to prevent a liquid from being leaked. Therefore, in a case where a liquid is filled in the case 26, it is possible to store the liquid without leakage.

In the housing 25, a through-hole 48 penetrating the case 26 is formed. If a liquid surface of a liquid accumulated in the case 26 becomes higher than the through-hole 48, the liquid is discharged from the case 26 through the through-hole 48. A height of a lower edge of the through-hole 48 becomes almost the same as the wire top of the wire 19 (the apex portion of the convex shape of the wire 19 having the upwardly convex center portion as described above) or higher than the wire top. Below the through-hole 48, a resin receiving portion 49 is provided on the outer surface of the housing 25. The resin receiving portion 49 includes a resin pool 50 which is a recess portion for storing the liquid discharged from the through-hole 48. It is preferable that the height of the resin pool 50 should be lower than that of the through-hole 48. Further, it is preferable that the height of the edge of the resin pool 50 should be higher than that of the through-hole 48 so as to prevent the resin receiving portion 49 from overflowing with the liquid.

The switching device 3 shown in FIG. 14 is manufactured by the same manufacturing method as that for the switching device 1 according to the third exemplary embodiment. That is, the manufacturing method includes an injection process of injecting the Silicone Resin 30 into the case 26 up to a predetermined height, a depressurizing process of leaving the case 26 under the reduced pressure after the injection process, so as to raise the liquid surface of the Silicone Resin 30 for degassing, a detection process of detecting that the liquid surface of the Silicone Resin 30 has risen in the depressurizing process, and a hardening process of hardening the Silicone Resin 30.

The Silicone Resin 30 that is injected in the injection process is the same as that of the third exemplary embodiment, and the injection amount of the Silicone Resin 30 is set such that the bonding surfaces 21 and 22 are soaked in the Silicone Resin 30 and at least a portion of the wire 19 is exposed from the liquid surface of the Silicone Resin 30. In a state in which the Silicone Resin 30 has been injected up to that height, since the Silicone Resin 30 does not reach the through-hole 48, the Silicone Resin 30 is not discharged from the through-hole 48.

In the subsequently performed depressurizing process, in the case 26 under the reduced pressure, the Silicone Resin 30 is pushed up, together with air bubbles, such that the liquid surface of the Silicone Resin 30 rises beyond the height of the wire top of the wire 19. In this case, the Silicone Resin 30 is attached to the entire wire 19, and the liquid surface of the Silicone Resin 30 reaches a position higher than the through-hole 48 formed in the housing 25. Therefore, the Silicone Resin 30 is discharged from the case 26 through the through-hole 48, and is accumulated in the resin pool 50. Next, while the case 26 is left under the reduced pressure or after the depressurized state is released, the detection process is performed.

Figure 15:
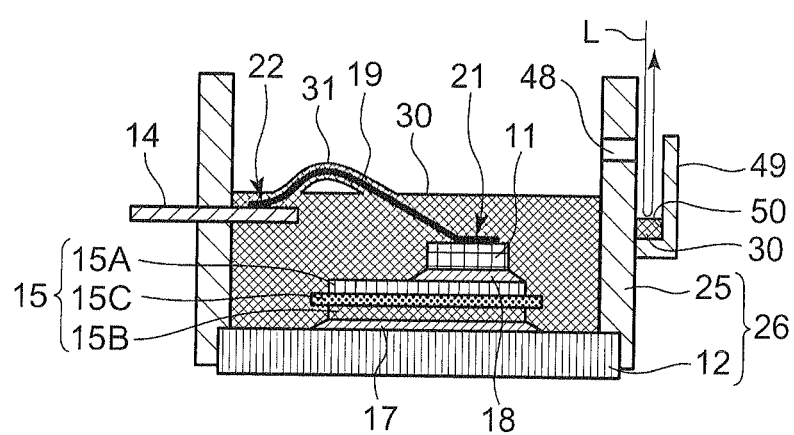
FIG. 15 is an explanatory view illustrating a detection process of a method of manufacturing a switching module according to the fifth exemplary embodiment.

FIG. 15 is an explanatory view of the detection process of the process of manufacturing the switching device 3. As shown in FIG. 15, in the detection process, a light source (not shown) irradiates the inspection light L from above the case 26 toward the resin pool 50. Since the inspection light L is reflected by the bottom surface of the resin pool 50 or the Silicone Resin 30 accumulated in the resin pool 50, the reflected light can be received by a light receiving unit (not shown), so as to detect the Silicone Resin 30 accumulated in the resin pool 50. The inspection light L is the same as the inspection light L described in the third exemplary embodiment. As the inspection light L, light having a wavelength that is easily absorbed by the Silicone Resin 30 may be used in a structure in which the reflectance of the inspection light L at the bottom surface of the resin pool 50 is high, or light having a wavelength that is reflected by the surface of the Silicone Resin 30 with high reflectance may be used in a structure in which the reflectance of the bottom surface of the resin pool 50 is low.

As described above, the switching device 3 includes the case 26 configured by bonding the housing 25 to the base 12, the through-hole 48 is formed in the housing 25 constituting the side surface of the case 26, and the resin pool 50 capable of storing the Silicone Resin 30 is formed on an outer surface of the case 26 below the through-hole 48. Therefore, in a case where the liquid surface of the Silicone Resin 30 rises beyond the height of the wire top of the wire 19 in the depressurizing process, the Silicone Resin 30 flows into the resin pool 50 through the through-hole 48. The Silicone Resin 30 having flowed into the resin pool 50 can be easily detected in the detection process by an optical method irradiating the inspection light L. Therefore, it is possible to easily determine whether the Silicone Resin 30 has been attached to the entire wire 19 exposed from the top surface of the Silicone Resin 30 in the depressurizing process.

Further, in the switching device 3, since the resin receiving portion 49 is provided on the outside of the case 26, and the Silicone Resin 30 flows into the resin pool 50 of the resin receiving portion 49 through the through-hole 48, the resin receiving portion 49 does not protrude inside the case 26, and dose not interfere with the process of disposing the substrate 15 in the case 26 and the process of forming the wire 19. Therefore, it is possible to easily detect that the Silicone Resin 30 has been attached to the wire 19, without influencing the disposition of the components in the case 26 and other processes. Further, since it is not required to secure a space for providing the resin receiving portion 49 in the case 26, there are merits that arrangement of individual units in the case 26 might not be restricted for the circumstances of the detection process and the degree of freedom of a layout of the inside of the case 26 might not be damaged.

[Sixth Exemplary Embodiment]

Figure 16:
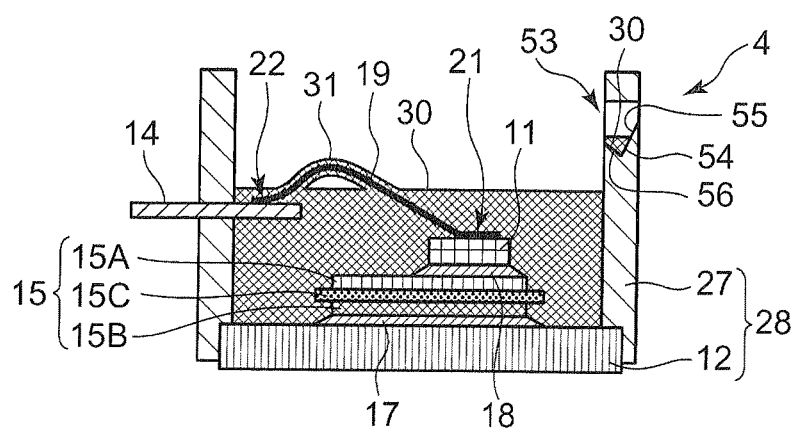
FIG. 16 is a main-part cross-sectional view of a switching device according to a sixth exemplary embodiment.

FIG. 16 is a main-part cross-sectional view illustrating a structure of a switching device 4 according to a sixth exemplary embodiment of the present invention. In the sixth exemplary embodiment, parts configured in the same way as the above-mentioned third exemplary embodiment are denoted by the same reference symbols, and the redundant description will not be repeated. Similarly to the switching device 1 described in the third exemplary embodiment, the switching device 4 is configured by putting a substrate 15 having a semiconductor device 11 mounted thereon, in a case 28, and connecting an external terminal 14 provided to the case 28 and the semiconductor device 11 by a wire 19. The case 28 of the switching device 4 is configured by bonding a housing 27 to the circumferential edge portion of a base 12. A cross-section shape of the housing 27 may be a circle, similarly to the housing 13, or may be a square, or other polygons. The housing 27 and the base 12 are bonded to each other by an adhesive, so as to prevent a liquid from being leaked. Therefore, in a case where a liquid is filled in the case 28, it is possible to store the liquid without leakage.

A portion of the housing 27 is cut, so as to form a resin receiving portion 53. The resin receiving portion 53 is a through-hole that is formed by cutting an upper portion of the housing 27 and penetrates the case 28. The lower portion of the resin receiving portion 53 includes a recess portion that is formed by two oblique surfaces 55 and 56 and has a V-shaped cross-section, and the recess portion constitutes a resin pool 54 capable of storing the Silicone Resin 30. The height of the lower edge of the resin receiving portion 53 on the inside of the case 28 becomes almost the same as the wire top of the wire 19 (the apex portion of the convex shape of the wire 19 having the upwardly convex center portion as described above) or higher than the wire top. In the depressurizing process of the process of manufacturing the switching device 4, if the liquid surface of the Silicone Resin 30 rises beyond the edge of the resin receiving portion 53, the Silicone Resin 30 flows into the resin pool 54.

In the two oblique surfaces constituting the lower portion of the resin receiving portion 53, the upper edge of the oblique surface 55 on the outer side of the case 28 is higher than the upper edge of the oblique surface 56 on the inner side of the case 28. Therefore, it is difficult for the Silicone Resin 30 flowing into the resin pool 54 to flow from the resin receiving portion 53 to the outside of the case 28.

The switching device 4 shown in FIG. 16 is manufactured by the same manufacturing method as that for the switching device 1 according to the third exemplary embodiment. That is, the manufacturing method includes an injection process of injecting the Silicone Resin 30 into the case 28 up to a predetermined height, a depressurizing process of leaving the case 28 under the reduced pressure after the injection process, so as to raise the liquid surface of the Silicone Resin 30 for degassing, a detection process of detecting that the liquid surface of the Silicone Resin 30 has risen in the depressurizing process, and a hardening process of hardening the Silicone Resin 30.

The Silicone Resin 30 that is injected in the injection process is the same as that of the third exemplary embodiment, and the injection amount of the Silicone Resin 30 is set such that the bonding surfaces 21 and 22 are soaked in the Silicone Resin 30 and at least a portion of the wire 19 is exposed from the liquid surface of the Silicone Resin 30. In a state in which the Silicone Resin 30 has been injected up to that height, the Silicone Resin 30 does not reach the upper edge of the oblique surface 56, and thus the Silicone Resin 30 does not flow into the resin pool 54.

In the subsequently performed depressurizing process, in the case 28 under the reduced pressure, the Silicone Resin 30 is pushed up, together with air bubbles, such that the height of the wire top of the wire 19 rises beyond the height of the wire top of the wire 19. In this case, the Silicone Resin 30 is attached to the entire wire 19, and the liquid surface of the Silicone Resin 30 reaches a position higher than the upper edge of the oblique surface 56. Therefore, the Silicone Resin 30 flows into the resin receiving portion 53 and is accumulated in the resin pool 54. Next, while the case 10 is left under the reduced pressure or after the depressurized state is released, the detection process is performed.

Figure 17:
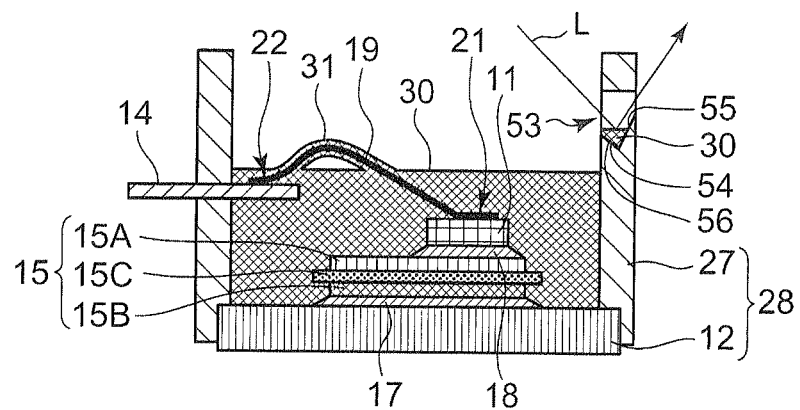
FIG. 17 is an explanatory view illustrating a detection process of a method of manufacturing a switching module according to the sixth exemplary embodiment.

FIG. 17 is an explanatory view of the detection process of the process of manufacturing the switching device 4. As shown in FIG. 17, in the detection process, a light source (not shown) irradiates the inspection light L from obliquely above the case 28 toward the resin pool 54. In the example of FIG. 17, the inspection light L is irradiated from the inside of the case 28 toward the outside of the case 28. In a case where there is no Silicone Resin 30 in the resin pool 54, the inspection light L is reflected toward the incident side of the inspection light L, that is, the inside of the case 28 by the oblique surface 55. In contrast, in a case where the Silicone Resin 30 remains in the resin pool 54, the inspection light L is reflected by the top surface of the Silicone Resin 30. Before the hardening process, since the Silicone Resin 30 has the mobility, the top surface of the Silicone Resin 30 becomes horizontal. Therefore, the inspection light L is reflected toward the outside of the housing 27 as shown in FIG. 17.

Therefore, in the detection process, it is possible to optically detect the Silicone Resin 30 accumulated in the resin pool 54 by detecting the direction of the reflected light of the inspection light L. The inspection light L is the same as the inspection light L described in the third exemplary embodiment. If a light receiving unit (not shown) is disposed in the vicinity of the light source emitting the inspection light L, and the light receiving unit receives the reflected light, the amount of received light is large in the case where there is no Silicone Resin 30 in the resin pool 54, and the amount of received light is small in the case where the Silicone Resin 30 remains. On the basis of the difference in the amount of received light, it is possible to detect the Silicone Resin 30 accumulated in the resin pool 54. In this case, if the reflectance of the inspection light L at the oblique surface 55 is high, and the wavelength of the inspection light L is set to a wavelength that is easily absorbed by the Silicone Resin 30, the difference in the amount of received light becomes noticeable. Further, if the light receiving unit (not shown) is provided in the direction of the reflected light shown by an arrow in FIG. 17, and the light receiving unit receives the reflected light, the amount of received light is small in the case where there is no Silicone Resin 30 in the resin pool 54, and the amount of received light is large in the case where the Silicone Resin 30 remains. In this case, if the reflectance of the oblique surface 55 is set to be low, and the wavelength of the inspection light L is set to a wavelength that is reflected by the surface of the Silicone Resin 30 with high reflectance, the difference in the amount of received light becomes noticeable, and thus easier and more reliable detection becomes possible.

As described above, the switching device 4 includes the case 28 configured by bonding the housing 27 to the base 12, the resin receiving portion 53 is formed to penetrate the housing constituting the side surface of the case 28, and the resin receiving portion 53 includes the resin pool 54 that is formed by the two oblique surfaces 55 and 56 and has a V-shaped cross-section. In a case where the liquid surface of the Silicone Resin 30 rises beyond the height of the wire top of the wire 19 in the depressurizing process, the Silicone Resin 30 flows into the resin pool 54. The Silicone Resin 30 having flowed into the resin pool 54 can be easily detected in the detection process by an optical method irradiating the inspection light L. Therefore, it is possible to easily determine whether the Silicone Resin 30 has been attached to the entire wire 19 exposed from the top surface of the Silicone Resin 30 in the depressurizing process.

Further, in the switching device 4, the resin receiving portion 53 is formed by perforating the housing 27, and the Silicone Resin 30 flowing into the resin receiving portion 53 is detected. Therefore, the resin receiving portion 53 does not protrude inside the case 28, and dose not interfere with the process of disposing the substrate 15 in the case 28 and the process of forming the wire 19. Therefore, it is possible to easily detect that the Silicone Resin 30 has been attached to the wire 19, without influencing the disposition of the components in the case 28 and other processes. Further, since it is not required to secure a space for providing the resin receiving portion 53 in the case 28, there are merits that arrangement of individual units in the case 28 might not be restricted for the circumstances of the detection process and the degree of freedom of a layout of the inside of the case 28 might not be damaged. Further, in a case where the reflected light of the inspection light L is received at a fixed position, the amount of received light differs considerably between the case where the Silicone Resin 30 remains in the resin pool 54 and the case where there is no Silicone Resin 30 in the resin pool 54. Therefore, it is possible to reliably detect the Silicone Resin 30.

The above-mentioned exemplary embodiments absolutely represent the aspects of the present invention, and can be arbitrarily modified and applied within the range of the present invention. For example, in the above-mentioned exemplary embodiments, cases where, as the synthetic resin for covering the bonding surfaces 21 and 22, or 121 and 122, and the wire 19 or 119, the two-component Silicone Resin 30 or 130 is injected into the switching modules 1A or 102 have been described as examples. However, the present invention is not limited thereto, and the synthetic resin that is injected into the case is not limited to the Silicone Resin 30 and 130. In other words, any synthetic resin may be used as long as the synthetic resin has the mobility during injection, and hardens thereafter to be a gel state or solid. Further, the synthetic resin is preferably a material that has an insulation property and durability and does not corrode the wires 19 and 119 and the bonding surfaces 21, 22, 121, and 122 is preferable, and more preferably, a material that has light resistance, heat resistance, and water resistance to be capable of keeping a state in which the wires 19 and 119 and the metals of the bonding surfaces 21, 22, 121, and 122 are covered, even in a severe environment. Specifically, the synthetic resin is not limited to the Silicone Resin, but epoxy resin or the like can be used. The synthetic resin may be photo-curable or heat-curable, and may contain an additive or the like. For example, in a case of using a photo-curable resin, if laser beam is used as the inspection light L, the light is not dispersed such that the light is irradiated onto only the resin pool 42, 46, 50, or 54 that is a detection subject. Therefore, there is a merit that the detection might be performed without hardening the synthetic resin in the case 10, 24, 26, or 28. In the above-mentioned exemplary embodiments, the cases of manufacturing switching devices by injecting the Silicone Resin 30 or 130 into a switching module including the substrate 15 or 115 having the semiconductor device 11 or 111 mounted as an electronic component thereon have been described. However, the present invention can also be applied to devices using various circuit elements such as a capacitor and a resistor or various integrated circuits as the electronic component. Further, the shape of the case may be arbitrary, and, for example, a case having a lid for covering the upper face may be used. In this case, the lid may be open in the injection process. Moreover, the specific detailed components of the switching devices and the injection apparatuses can be arbitrarily modified.

Industrial Applicability

The present invention can be applied to electronic devices having semiconductor devices or the like, and methods of manufacturing them.

Description Of Reference Numerals

1, 2, 3, 4: Switching Device (Electronic Device)
1A: Switching Module
10: Case
11: Semiconductor Device (Electronic Element)
15: Substrate
19: Wire (Metal Wire)
21, 22: Bonding Surface
30: Silicone Resin (Synthetic Resin)
31: Coating Resin Film
101, 101A: Switching Device (Electronic Device)
102: Switching Module
110: Case
111: Semiconductor Device (Electronic Element)
115: Substrate
119: Wire (Metal Wire)
121, 122: Bonding Surface
130: Silicone Resin (Synthetic Resin)
131: Coating Resin Film
1100: Injection Apparatus
1150: Vacuum Chamber
1152: Injection Nozzle

The invention claimed is:

1. A method of manufacturing an electronic device in which a metal wire is bonded to an electronic component contained in a case by wire bonding and a bonding surface to which the metal wire is bonded is covered with a synthetic resin, the method comprising:

injecting an amount of synthetic resin into the case such that at least a portion of the metal wire is exposed from a top surface of the synthetic resin; and leaving the case to which the synthetic resin is injected under reduced pressure so as to raise a liquid surface of the synthetic resin due to the reduced pressure, and covering the metal wire exposed from the top surface of the synthetic resin with the synthetic resin.

2. The method of manufacturing an electronic device according to claim 1, wherein both ends of the metal wire is bonded to the bonding surface such that the metal wire has an upwardly convex shape, and wherein, when the synthetic resin is injected into the case, the synthetic resin is injected up to a height to expose at least an apex portion of the convex metal wire from the top surface of the injected synthetic resin and to cover an entire bonding surface with the injected synthetic resin.

3. The method of manufacturing an electronic device according to claim 1, wherein the case includes a resin receiving portion into which the synthetic resin flows when the liquid surface of the injected synthetic resin becomes higher than the metal wire, and wherein the synthetic resin flowing into the resin receiving portion is detected.

4. The method of manufacturing an electronic device according to claim 3, wherein the resin receiving portion includes a recess portion adapted to store the synthetic resin, and
wherein the synthetic resin flowing into the recess portion is optically detected by irradiating the recess portion with inspection light.

5. A method of manufacturing an electronic device in which a metal wire is bonded to an electronic component contained in a case by wire bonding and a bonding surface to which the metal wire is bonded is covered with a synthetic resin, the method comprising:
injecting an amount of synthetic resin into the case such that at least a portion of the metal wire is exposed from a top surface of the synthetic resin; and
further injecting more synthetic resin into the case wherein an injection nozzle adapted to inject the synthetic resin into the case moves above the metal wire so as to apply the synthetic resin to the portion of the metal wire exposed from the top surface of the liquid surface of the synthetic resin.

* * * * *